(12) United States Patent
Wu

(10) Patent No.: US 6,731,424 B1
(45) Date of Patent: May 4, 2004

(54) DYNAMIC GAIN FLATTENING IN AN OPTICAL COMMUNICATION SYSTEM

(75) Inventor: Yongan Wu, San Jose, CA (US)

(73) Assignee: Onetta, Inc., Sunnyvale, CA (US)

( * ) Notice: Subject to any disclaimer, the term of this patent is extended or adjusted under 35 U.S.C. 154(b) by 342 days.

(21) Appl. No.: 09/805,930

(22) Filed: Mar. 15, 2001

(51) Int. Cl.[7] .................................................. H01S 3/00
(52) U.S. Cl. ..................................... 359/337.1; 359/344
(58) Field of Search ............................... 359/344, 337.1

(56) References Cited

U.S. PATENT DOCUMENTS

| | | | |
|---|---|---|---|
| 4,379,289 A | 4/1983 | Peek | 340/555 |
| 4,651,317 A | 3/1987 | Tashiro et al. | 380/86 |
| 4,745,612 A | 5/1988 | Hayakawa et al. | 372/45 |
| 4,794,346 A | * 12/1988 | Miller | 330/4.3 |
| 5,039,194 A | 8/1991 | Block et al. | 383/88 |
| 5,136,410 A | 8/1992 | Heiling et al. | 359/110 |
| 5,189,679 A | 2/1993 | Derry et al. | 372/45 |

(List continued on next page.)

FOREIGN PATENT DOCUMENTS

| | | |
|---|---|---|
| EP | 762 667 A2 | 3/1997 |
| JP | 5-37092 * | 5/1993 |
| JP | 11-275027 A2 | 8/1999 |
| WO | WO 97/28584 | 8/1997 |
| WO | WO 99/66607 | 12/1999 |
| WO | WO 99/67609 | 12/1999 |
| WO | WO 00/4613 A1 | 1/2000 |
| WO | WO 00/14909 | 3/2000 |
| WO | WO 00/49721 | 8/2000 |

OTHER PUBLICATIONS

Silver et al. "Design and ASE Characteristics of 1550–nm Polarization Insensitive Semiconductor Optical Amplifiers Containing Tensile and Compressive Wells" IEEE Journal of Quantum Electronics, vol. 36, No. 1, p. 118–122, Jan., 2000.
Ryu et al. "Fabrication and Analysis of Polarization Insensitive 1.55um InGaAsP/InP Quantum Well Semiconductor Optical Amplifiers" p. 642.
Liu et al. "A Study on the Polarization Sensitive Performance of the Strained Quantum Well Semiconductor Optical Amplifiers." SPIE vol. 3896, p. 494–498 Nov., Dec., 1999.
Schimpe et al. "Compact 2x2 Switch with Optical Amplifier Gates" CLEO, 1994, p. 77.
Kitamura et al. "Angled Facet S–Bend Semiconductor Optical Amplifiers for High–Gain and Large–Extinction Ratio" IEEE Photonics Technology Letters, vol. 11, No. 7 (Jul., 1999).
Zhu et al. "1.28 Tbit/s (32 x 40 Gbit/s) Transmission over 1000 km NDSF Employing Distributed Raman Amplification and Active Gain Flattening" Electronics Letters, vol. 37, No. 1, p. 43–45 (Jan. 4, 2001).

(List continued on next page.)

*Primary Examiner*—Mark Hellner
(74) *Attorney, Agent, or Firm*—G. Victor Treyz

(57) ABSTRACT

An optical device for dynamic gain adjusting includes a dynamic gain adjusting filter having one or more semiconductor optical amplifiers. The dynamic gain adjusting filter may allow dynamically-adjustable spectral gain characteristics. A dynamic gain adjusting filter may be part of an amplifier module or other optical device module, or as an optical module itself. The dynamic gain adjusting filter may be used to reduce gain ripple, control gain tilt, and/or compensate for other gain variations. The one or more semiconductor optical amplifiers of the dynamic gain adjusting filter may be designed and/or controlled to produce different gain profiles. For example, the active region of the semiconductor optical device may comprise several subregions having different structures, dimensions, and/or doping characteristics.

10 Claims, 24 Drawing Sheets

U.S. PATENT DOCUMENTS

| | | | |
|---|---|---|---|
| 5,208,183 A | 5/1993 | Chen et al. | 437/129 |
| 5,218,613 A | 6/1993 | Serreze | 372/45 |
| 5,253,104 A | 10/1993 | Delavaux | 359/341 |
| 5,287,377 A | 2/1994 | Fukuzawa et al. | 372/45 |
| 5,345,456 A | 9/1994 | Dai et al. | 372/22 |
| 5,428,471 A | 6/1995 | McDermott | 359/177 |
| 5,430,759 A | 7/1995 | Yokev et al. | 375/202 |
| 5,673,141 A * | 9/1997 | Gambini | 359/341 |
| 5,861,981 A | 1/1999 | Jabr | 359/341 |
| 5,933,552 A | 8/1999 | Fukushima et al. | 385/24 |
| 5,945,668 A | 8/1999 | Davidson | 250/227.15 |
| 5,946,129 A | 8/1999 | Xu et al. | 359/332 |
| 5,969,834 A | 10/1999 | Farber et al. | 359/110 |
| 6,014,235 A | 1/2000 | Norte | 359/109 |
| 6,016,213 A | 1/2000 | Farber et al. | 359/177 |
| 6,028,875 A | 2/2000 | Knight et al. | 372/46 |
| 6,040,938 A * | 3/2000 | Ducellier | 359/344 |
| 6,052,222 A | 4/2000 | Kitamura | 359/344 |
| 6,061,171 A | 5/2000 | Taylor et al. | 359/341 |
| 6,115,174 A | 9/2000 | Grubb et al. | 359/334 |
| 6,122,306 A | 9/2000 | Sartorius et al. | 372/96 |
| 6,141,477 A | 10/2000 | Kitamura | 385/313 |
| 6,151,157 A | 11/2000 | Ball et al. | 359/341 |
| 6,160,659 A | 12/2000 | Kinoshita | 359/337 |
| 6,192,058 B1 | 2/2001 | Abeles | 372/6 |
| 6,198,570 B1 | 3/2001 | Fukushima et al. | 359/337 |
| 6,215,581 B1 | 4/2001 | Yadlowsky | 359/337 |
| 6,215,805 B1 | 4/2001 | Sartorius et al. | 372/50 |

OTHER PUBLICATIONS

Ono et al., "Automatic Gain Control in Silica–Based EDFA with over 50nm Flat Gain Bandwidth using an all Optical Feedback Loop" $10^{th}$ Optical Amplifiers and their Applications Technical Digest, Jun. 9–11, 1999.

Takeda et al. "Active Gain Tilt Equalization by Preferentially 1.43$\mu$m–or 1.48$\mu$m–Pumped Raman Amplification" OSA Optical Gain Amplifiers and their Applications, vol. 30, p. 101–105 (1999).

Saini et al. "Lossless 1x2 Optical Switch Monolithically Integrated on a Passive Active Resonant Coupler (PARC) Platform" IEEE Photonics Technology Letters, vol. 12, No. 7, Jul. 2000.

* cited by examiner

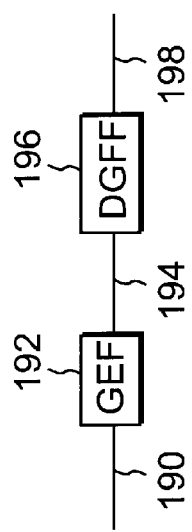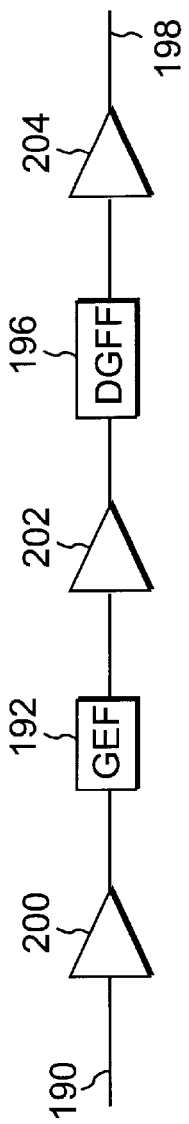

DYNAMIC GAIN FLATTENING IN AN OPTICAL COMMUNICATION SYSTEM

BACKGROUND OF THE INVENTION

This invention relates to fiber-optic communications systems, and more particularly, to dynamic gain adjusting in optical communications systems.

In optical networks that use wavelength division multiplexing, multiple wavelengths of light are used to support multiple communications channels on a single fiber. Optical amplifiers are used in such networks to amplify optical signals that have been subject to attenuation over multi-kilometer fiber-optic links.

There are many fiber spans in a typical network link. For example, a long-haul network link may be approximately 400–600 km in length and an ultra-long-haul network link may be 3000–5000 km in length. Each fiber span is typically 40–130 km in length, so there may be many amplifiers in such links.

A typical amplifier may include erbium-doped fiber amplifier components that are pumped with diode lasers. Erbium-doped fiber amplifier stages increase the strength of the optical signals being transmitted over the fiber-optic links.

The intrinsic gain spectrum of erbium-doped fiber amplifiers is not flat. Unless the gain spectrum of an erbium-doped fiber amplifier is flattened, different wavelengths of light will be amplified by different amounts. This is undesirable, particularly in arrangements in which many amplifiers are cascaded in a communications link.

One way in which to flatten the gain spectrum in an erbium-doped fiber amplifier is to use a gain equalization filter. A gain equalization filter may be inserted in the optical path of the erbium-doped fiber amplifier between coils of erbium-doped fiber. The gain equalization filter has a loss spectrum that tracks the erbium-fiber gain spectrum. The gain equalization filter may therefore be used to introduce losses in the portions of the spectrum where the erbium-doped fiber has gain peaks. This flattens the gain spectrum of the amplifier.

Two important figures of merit for an optical amplifier are gain ripple and noise figure. Gain ripple is a measure of the spectral variations in the gain of the amplifier. The noise figure for an amplifier is an indicator of the amount of noise that the amplifier adds to the optical signal that is being amplified.

Gain ripple may arise from the use of imperfect gain equalization filters. Gain ripple may also arise from the use of other amplifier components with wavelength-dependent losses. For example, wavelength-division multiplexer (WDM) couplers and other components may introduce wavelength-dependent losses that affect gain ripple. Dynamic contributions to gain ripple include spectral hole burning and stimulated Raman scattering. With spectral hole burning, the gain of the erbium fiber is reduced at wavelengths immediately adjacent to an active signal channel. Raman scattering may influence gain ripple when the optical signals being amplified by the amplifier are sufficiently strong that the signals on some channels produce Raman gain for signals on other channels. There may also be drift in the gain spectrum of an amplifier due to fiber and component aging effects.

Gain tilt is a type of gain ripple that may arise when the input power to the amplifier changes. Gain tilt has previously been controlled using variable optical attenuators. Such attenuators may, however, adversely affect the noise figure of the amplifier when large values of attenuation are used to correct for the gain tilt introduced when handling relatively large input powers.

The performance of optical amplifiers in optical communications systems is generally monitored using optical spectrum analyzers. An optical spectrum analyzer in a communications system installation may be used to monitor the performance of a number of optical amplifiers.

It is an object of the present invention to provide an optical device and method for adjustably and dynamically controlling the spectral gain of an optical signal. It is a further object of the present invention to provide an optical device and method for compensating for gain ripple, gain tilt, and/or other gain variations, whatever the source. It is further object of the present invention to provide an optical device and method in which the optical characteristics of an optical amplifier may be monitored and controlled to reduce amplifier noise and gain ripple, gain tilt, and/or other gain variations.

SUMMARY OF THE INVENTION

This and other objects of the invention are accomplished in accordance with the principles of the present invention by providing an optical device having a dynamic spectral filter or dynamic spectral gain adjusting device, such as a dynamic gain flattening filter, with dynamically-adjustable spectral gain characteristics, the dynamic gain adjusting filter including at least one semiconductor optical amplifier. The dynamic gain adjusting device, such as a dynamic gain flattening filter, may be used to reduce gain ripple, control gain tilt, and/or compensate for other spectral gain variations.

A dynamic gain adjusting filter in accordance with the present invention may be part of an amplifier module or other optical device module, or as a module itself. Further, the dynamic gain adjusting filter may be implemented with other optical components, including, for example, a fixed gain equalization filter that adjusts the optical signal spectrum through attenuation.

The dynamic gain adjusting filter may be designed and operated to produce a desired spectral gain or loss profile for optical signals passing through it. The dynamic gain adjusting filter includes at least one semiconductor optical amplifier. For example, dynamic gain adjusting filter may be implemented by a series connection of multiple semiconductor optical amplifiers.

One or more semiconductor optical amplifiers of the dynamic gain adjusting filter may be designed and/or controlled to produce different gain profiles. For example, the active region of the semiconductor optical device may comprise several subregions having different structures, dimensions, and/or doping characteristics. Processes for forming the subregions are described. Moreover, the composite spectral gain profile may be adjustable by varying the temperature and/or the bias voltage across the active region or one or more of the subregions.

The optical signals may pass through an active region of a semiconductor optical amplifier from one end to another. One end of the semiconductor optical amplifier may include a mirrored or partially mirrored surface so that optical signals will be reflected, at least in part, by the surface and travel back through the active region. Optical devices and packaging may be provided to facilitate either of these arrangements.

Further features of the invention and its nature and various advantages will be more apparent from the accompanying drawings and the following detailed description of the preferred embodiments.

BRIEF DESCRIPTION OF THE DRAWINGS

FIG. 19 is a schematic of an exemplary arrangement of a gain equalization filter and a dynamic gain adjusting filter in accordance with the present invention.

FIG. 20 is a schematic of an exemplary arrangement of a gain equalization filter, a dynamic gain adjusting filter, and amplifiers in accordance with the present invention.

DETAILED DESCRIPTION OF THE PREFERRED EMBODIMENTS

Figure 1:
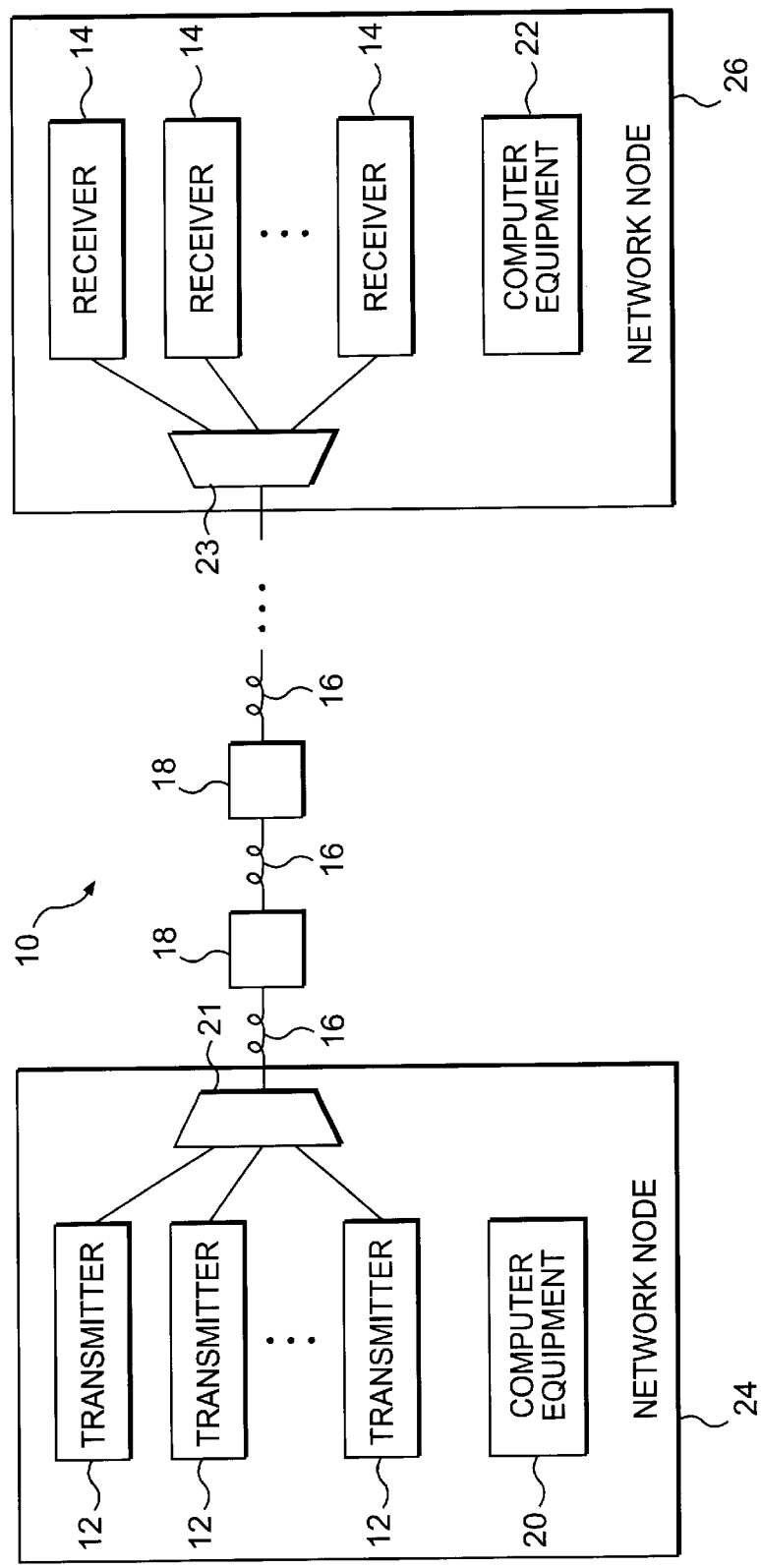
FIG. 1 is a schematic diagram of an illustrative optical communications link using optical devices in accordance with the present invention.

An illustrative optical communications link 10 in accordance with the present invention is shown in FIG. 1. As shown in FIG. 1, the optical communications link 10 may be used to support wavelength-division-multiplexing (WDM) arrangements in which multiple communications channels are provided using multiple wavelengths of light. For example, the link of FIG. 1 may support a system with 40 channels, each using a different optical carrier wavelength. Optical channels may be modulated at, for example, approximately 10 Gbps (OC-192). The carrier wavelengths that are used may be in the vicinity of 1530–1560 nm. These are merely illustrative system characteristics. If desired, more channels may be provided (e.g., hundreds of channels), signals may be modulated at higher data rates (e.g., approximately 40 Gbps for OC-768), or a wider range of carrier wavelengths may be supported (e.g., 1480–1610 nm).

More particularly, optical communications link 10 spans a first network node 24 and a second network node 26. Network nodes 24 and 26 may be two nodes of a larger optical communications network system containing any number of nodes. Network node 24 includes a plurality of transmitters 12 and computer equipment 20. Each transmitter 12 generates an optical signal having a different carrier wavelength. For example, the transmitters 12 may be distributed feedback laser diodes operating at different wavelengths. Alternatively, the transmitters 12 may include laser diodes operating at the same wavelength and wavelength converters for converting optical signals from the laser diodes to different carrier wavelengths appropriate for transmission.

The optical signals from transmitters 12 are provided to a wavelength division multiplexer 21, which combines the optical signals to produce WDM optical signals. The wavelength division multiplexer 21 may be, for example, an arrayed waveguide-type or a thin film filter-type multiplexer.

The WDM optical signals may be transmitted over a series of fiber links. Each fiber link may include a span 16 of optical fiber. Fiber spans may be on the order of 40–130 km in length for long-haul networks or may be any other suitable length for use in signal transmission in an optical communications network.

Optical devices 18 may be disposed between spans 16. An optical devices 18 may be, for example, an optical amplifier, an add/drop module, a switch, a router, a dynamic gain adjusting filter(e.g., a dynamic gain adjusting filter or a dynamic gain tilt controller), a wavelength converter or other optical device, or a combination of the foregoing. For example, as optical signals travel along the optical fibers 16, signal strength is attenuated. Accordingly, optical device 18 may include an optical amplifier to amplify the optical signals between successive spans of fiber.

WDM optical signals may be received at network node 26. The WDM optical signals may be demultiplexed into a plurality of optical signals by wavelength division demultiplexer 23. The plurality of output signals may be provided, respectively, to a plurality of receivers 14. Each receiver 14 may be, for example, a PIN diode coupled to transimpedance amplifier.

One or more telemetry channels may be used for monitoring and controlling system components, rather than carrying network data traffic. Such telemetry channels may be used, for example, to allow computer equipment such as computer equipment 20 and 22 at network nodes 24 and 26 or at central offices to communicate with system components such as optical devices 18. As an example, a telemetry channel operating at a wavelength of 1510 nm may be used for monitoring and control functions. This is, however, merely illustrative. Any wavelength or wavelengths may be used to support supervisory or network management and control functions if desired.

With the arrangement of FIG. 1, status information from optical devices 18 may be passed to network control and management software running on computer equipment 22 using the telemetry channel. The telemetry channel of a link between node 26 and node 24 that is arranged to support communications in the opposite direction from link 10 may be used to provide this status information to network control and management software running on computer equipment 20.

Control commands for adjusting the operation of optical devices 18 may be generated by the network software running on computer equipment 20. The control commands may be transmitted by a transmitter 12 on the telemetry channel and received by the appropriate devices 18.

Figure 2:
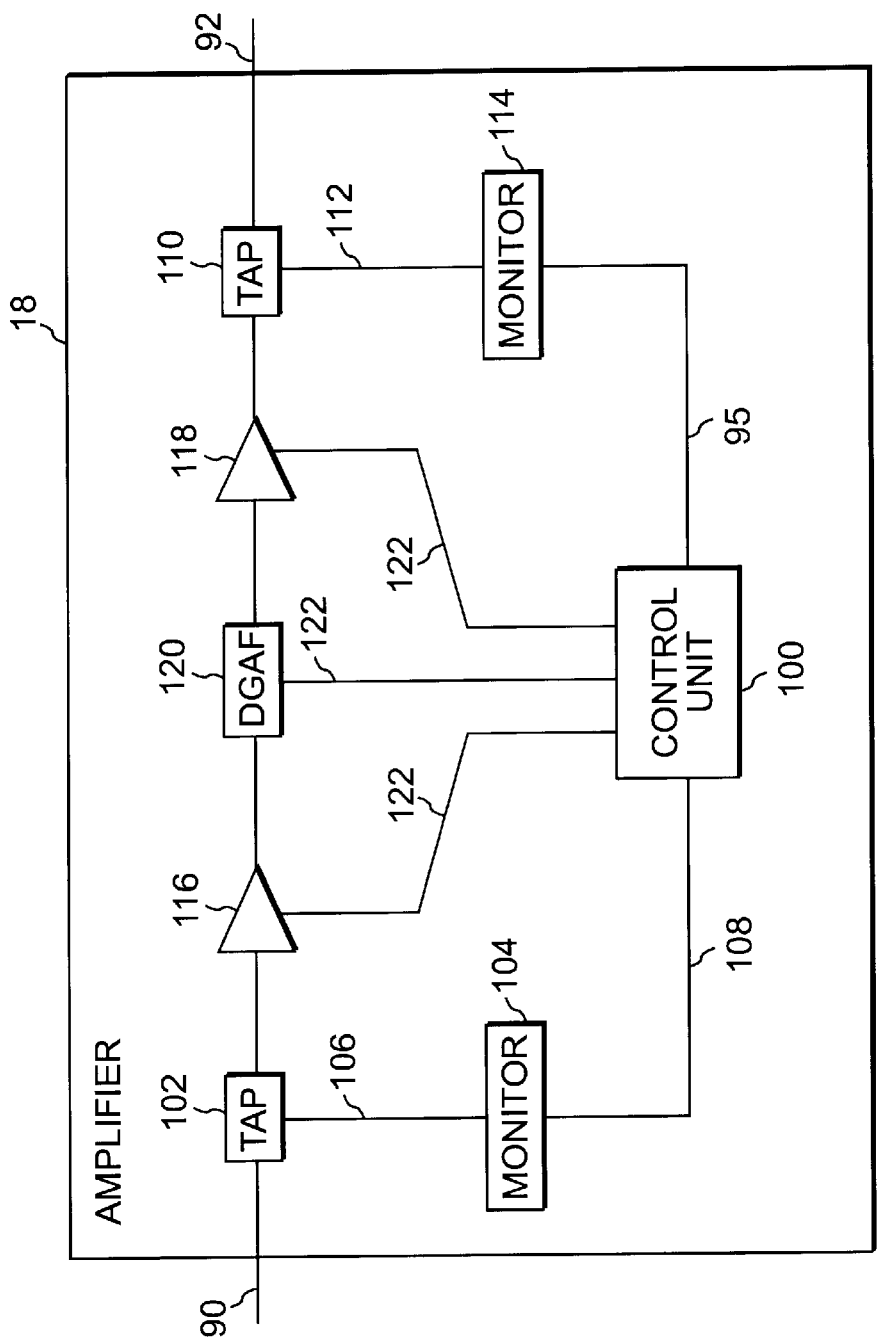
FIG. 2 is a schematic diagram of an optical amplifier module with dynamic gain adjusting capabilities in accordance with the present invention.

An illustrative arrangement of an optical device 18 as an amplifier module with dynamic gain adjusting capabilities is shown in FIG. 2. The amplifier module of FIG. 2 is provided as an example and, as noted above, the dynamic gain adjusting capability may be implemented in other optical devices, such as add/drop modules, monitors, or other optical devices. Moreover, the dynamic gain adjusting features may be implemented as a separate module or rack-mounted element.

As shown in FIG. 2, input signals from a span of fiber 16 may be provided at fiber input 90. Amplified and gain-adjusted output signals may be provided at fiber output 92.

An optical tap 102 receives input optical signals at fiber input 90. Tap 102 couples the input optical signals to amplifier stage 116 and to optical monitor 104 through fiber 106. Similarly, optical tap 110 receives optical signals from amplifier stage 118 and couples the optical signals to the fiber output 92 and to optical monitor 114 through fiber 112. Optical taps 102 and 110 may be any suitable optical tap. For example, taps 102 and 110 may be low-loss taps that are relatively wavelength insensitive. Tap 102 may be, for example, a 2%/98% tap that direct 2% of the input power received from optical input 90 to fiber 106 for measurement by optical monitor 104 and directs 98% of the input power on fiber 90 to amplifier stage 116. Similarly, tap 110 may be, for example, a 2%/98% tap that direct 2% of the input power received from amplifier stage 118 to fiber 112 for measurement by optical monitor 114 and directs 98% of the input power to fiber output 92.

Optical monitors 104 and 114 receive optical signals from tap 102 and tap 110, respectively. Based on the received optical signals, each optical monitor 104 and 114 generates electrical signals that may be provided to control unit 100 through lines 108 and 95. Optical monitors 104 and 114 may be a wavelength independent detectors or spectral monitors. One suitable spectral monitor is based on a dispersive element and detector arrangement. For example, a fixed dispersive element (e.g., a prism, grating, thin-film device, arrayed waveguide device, etc.) and an optical detector array (e.g., a charge-coupled device (CCD) array or a photodiode array). Optical monitors 104 and 114 may also have a movable dispersive element and a fixed detector arrangement. If desired, more than one dispersive element may be used. A Fabry-Perot etalon having an etalon length that may be varied using mechanical positioners may also be used for one or both of the optical monitors. Transimpedance amplifiers and analog-to-digital converters may be used for generating digital signals representative of the input and output powers to control unit 100. These are merely illustrative examples of optical monitors 104 and 114. Any suitable optical monitor may be used if desired.

Control unit 100 may use power measurements from monitors 104 and 114 to control the transient behavior of amplifier stages 116 and 118 and to control the operation of dynamic gain adjusting filter 120. Dynamic gain adjusting filter 120 may be considered a dynamic filter or a dynamic spectral filter. Control unit 100 may be based on any suitable electronic control equipment such as a microprocessor, microcontroller, programmable logic device, application-specific integrated circuit, memory, etc.

The amplifier module 18 may have multiple stages. FIG. 2 illustrates an embodiment having two stages 116 and 118. Stage 116 may be, for example, a low-noise preamplifier stage and stage 118 may be a power stage. Amplifier stages 116 and 118 may include one or more rare-earth doped fiber coils or other suitable gain components such as semiconductor amplifiers, parametric amplifiers, or a Raman-pumped fiber amplifier, or combinations thereof. Rare-earth fiber coils may be pumped by one or more diode lasers or other suitable pump sources. For clarity, some aspects of the present invention are described in the context of erbium-doped fiber amplifiers. Any other suitable amplifier gain arrangement may, however, be used if desired. For example, one or both amplifier gain stages may be omitted and/or other monitoring schemes can be used.

Dynamic gain adjusting filter 120 may include one or more semiconductor optical amplifiers, such as those described in more detail below. The dynamic gain adjusting filter 120 may operate to compensate for gain peaks in the amplifier arrangement, in this case stages 116 and 118, or other variations in gain that may occur in the optical signals. For example, the dynamic gain adjusting filter 120 may be controlled to flatten the spectral gain experienced by optical signals passing through the amplifier module. Dynamic gain adjusting filter 120 may be controlled electrically by control unit 100 over paths 122. Dynamic gain adjusting filter 120 according to the present invention not only compensates for gain variations to produce the overall required spectra shape, but may also provide gain. Consequently, the overall noise figure may be improved.

Dynamic gain adjusting filter 120 may be implemented as a dynamic gain tilt controller, which compensates for gain tilt introduced by the amplifier arrangement. As described above, input power variations to the amplifiers may result in a tilt in the resulting gain profile. Dynamic gain adjusting filter 120 may be used to adjust the transmission spectra to compensate for gain tilt otherwise produced by the amplifiers.

It should be understood that additional components may be included in the arrangement shown in FIG. 2, at the input, output, or interposed between the components shown. For example, a spectral filter may be added to the input optical path. The spectral filter may be used to filter spectral components so that the spectrum of the monitored input matches the gain spectrum of the amplifier arrangement. Additional optical components, such as a dispersion compensation device, various filters, monitors and other optical components, may also be provided.

Figure 3:
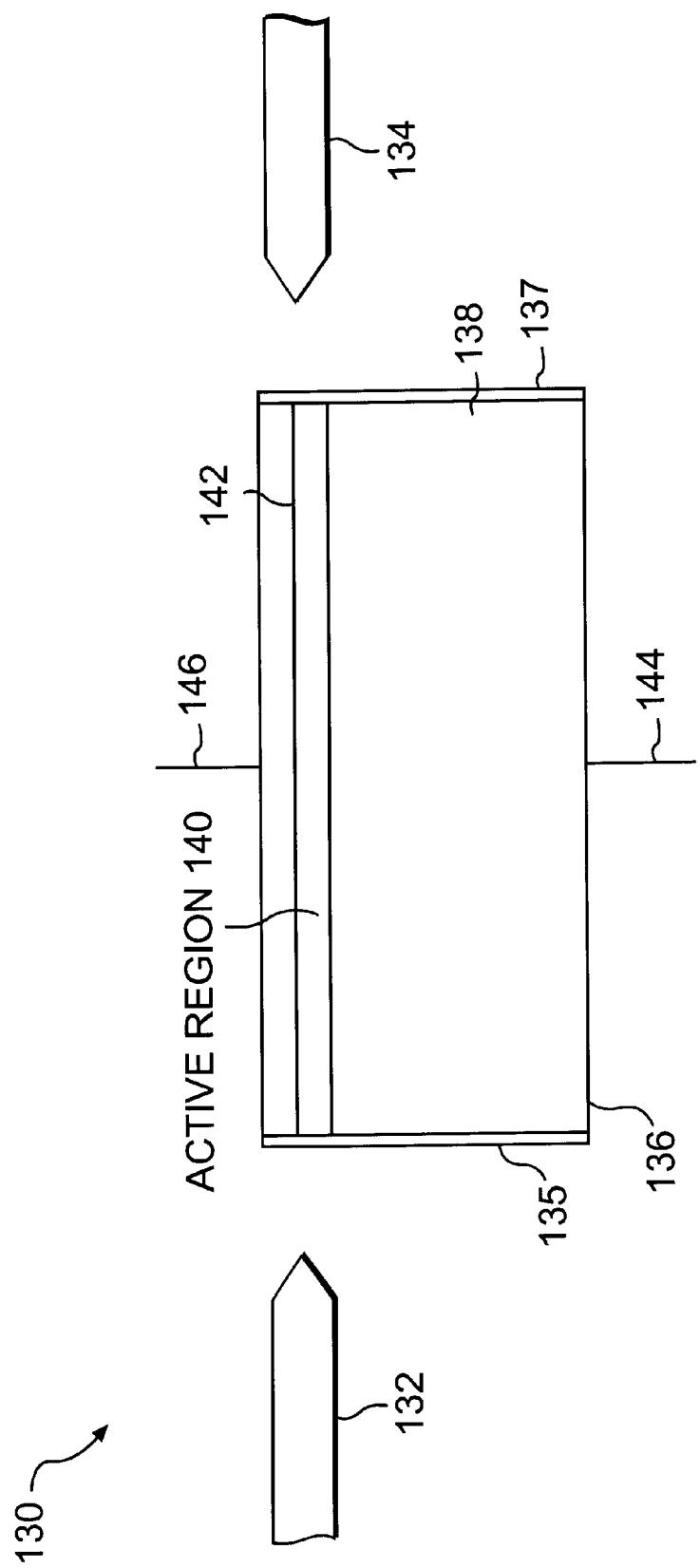
FIG. 3 is a schematic diagram of an exemplary dynamic gain adjusting filter using a semiconductor optical amplifier in accordance with the present invention.

FIG. 3 illustrates an example of a dynamic gain adjusting filter implemented as a semiconductor optical amplifier 130. The arrangement includes an input fiber 132, an output fiber 134, and a semiconductor optical amplifier device 136 between the input fiber 132 and output fiber 134. The fibers 132 and 134 may include wedge or conical integral fiber lenses. Alternatively, lenses or other optical elements may be provided to insert light from the input fiber 132 into the semiconductor optical amplifier device 136 and to insert light from the semiconductor optical amplifier device 136 into the output fiber 134. In addition, anti-reflective coatings 135 and 137 may be applied to the input and output facets of the semiconductor optical amplifier 136 to reduce coupling losses and semiconductor optical amplifier spectral ripples.

The semiconductor optical amplifier device 136 comprises a diode structure. An active region 140 that serves as a waveguide is formed between a p-type (n-type) semiconductor region 138 and an n-type (p-type) semiconductor region 142. The active region 140 may be formed by bulk semiconductor, a quantum well structure having one or more quantum wells, quantum wires, or quantum dots. The particular structure of the active region 140 may be selected, at least in part, depending on the gain and/or linewidth of the gain desired in the output optical signal. The gain profile of the active region 140 may be controlled by, among other things, the selection of materials, dimensions, dopants, doping levels, and doping profiles, to achieve the gain (loss) characteristics desired for a particular application. Semiconductor material used to form the semiconductor optical amplifier 120 may be InP, InGaAsP, GaAs, AlGaAs, InAlGaAs, InGaAsN, InGaAsSb, or any other suitable material.

Electrodes 144 and 146 are electrically coupled to semiconductor regions 138 and 142, respectively. The electrodes 144 and 146 are used to provide a biasing voltage that may be controlled, for example, by a control unit 100 or other suitable control. According to one mode of operation, voltages are applied to electrodes 144 and 146 to forward bias the active region 140. The forward bias generates a current I that inverts the carrier populations in the active region. Input light inserted into the active region 140 from input fiber 132 experiences gain through stimulated emission as it travels through the active region 140. The gain characteristics depend on the current I through the active region 140, all else being equal. Alternatively, the active region 140 may be reverse biased. In such a case, input light inserted into the active region 140 will experience loss through absorption as it travels through the active region 140.

As described below, the physical structure of the semiconductor optical amplifier device 136 may be designed for anticipated gain adjusting and/or tilt compensation. Moreover, the semiconductor optical amplifier device 136 may be biased to compensate for ripple, tilt, or other gain variations in the input optical signal and/or to pre-compensate for gain variations to be experienced by the optical signal. Further, the temperature of the semiconductor optical amplifier device 136 may be controlled, using a heater or cooler for example, to further adjust the gain characteristics.

Figure 4:
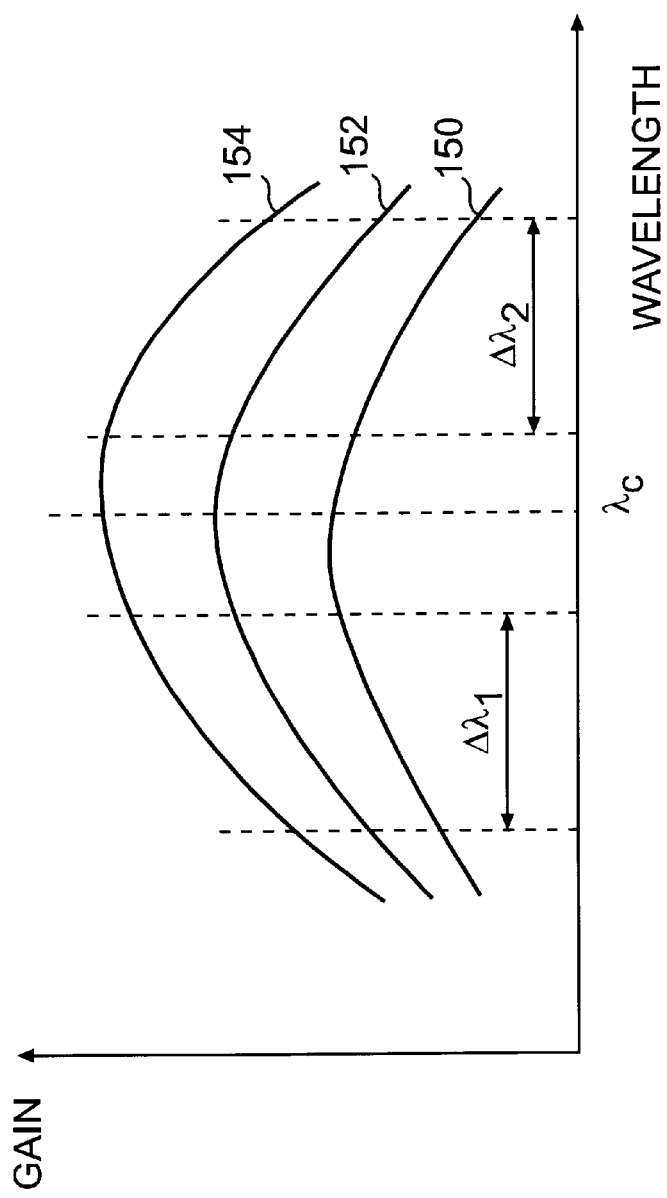
FIG. 4 is a graph of the gain spectrum for the exemplary dynamic gain adjusting filter of FIG. 3 under forward biasing conditions.

FIG. 4 illustrates exemplary gain characteristics of a semiconductor optical amplifier 130 according to the present invention. In this example, the gain characteristics of the semiconductor optical amplifier 130, achieved by forward biasing the active region 140, are used for gain adjusting or to compensate for other gain variations. FIG. 4 shows three gain curves 150, 152, and 154 as a function of wavelength. The gain curves 150, 152, and 154 correspond to different currents $I_1$, $I_2$, and $I_3$ through the active region 140. Currents $I_1$, $I_2$, and $I_3$ may be produced by controlling the forward bias voltage across electrodes 144 and 146 of the semiconductor optical amplifier 130. The semiconductor optical amplifier 130 may be designed to provide gain over a relatively broad range of wavelengths, as shown in the FIG. 4.

In the illustrated example, the gain increases to a peak value and then decreases. The peak gain occurs at a wavelength $\lambda_c$, referred to as the peak gain wavelength. Some variation in the peak gain wavelength $\lambda_c$ may occur under different biasing conditions. Gain curves 150, 152, and 154 each include a wavelength range $\Delta\lambda_1$ in which gain generally increases linearly as wavelength increases. Gain curves 150, 152, and 154 also include a wavelength range $\Delta\lambda_2$ in which gain generally decreases linearly as wavelength increases. The slopes of the generally linear regions vary in curves 150, 152, and 154 as a function of the current I, which depends on the forward bias voltage.

The semiconductor optical amplifier 130 may be designed and driven so that that the one or both of the wavelength ranges $\Delta\lambda_1$ and $\Delta\lambda_2$ cover wavelengths used in the transmission of optical signals. For example, the semiconductor optical amplifier 130 may be designed and driven so that wavelength range $\Delta\lambda_1$ covers all of the wavelengths used in transmission. By inserting input optical signals into the semiconductor optical amplifier 130 and controlling the forward biasing voltage, the semiconductor optical amplifier 130 can be used to compensate for gain tilt of optical amplifiers or other sources of gain tilt.

Figure 5:
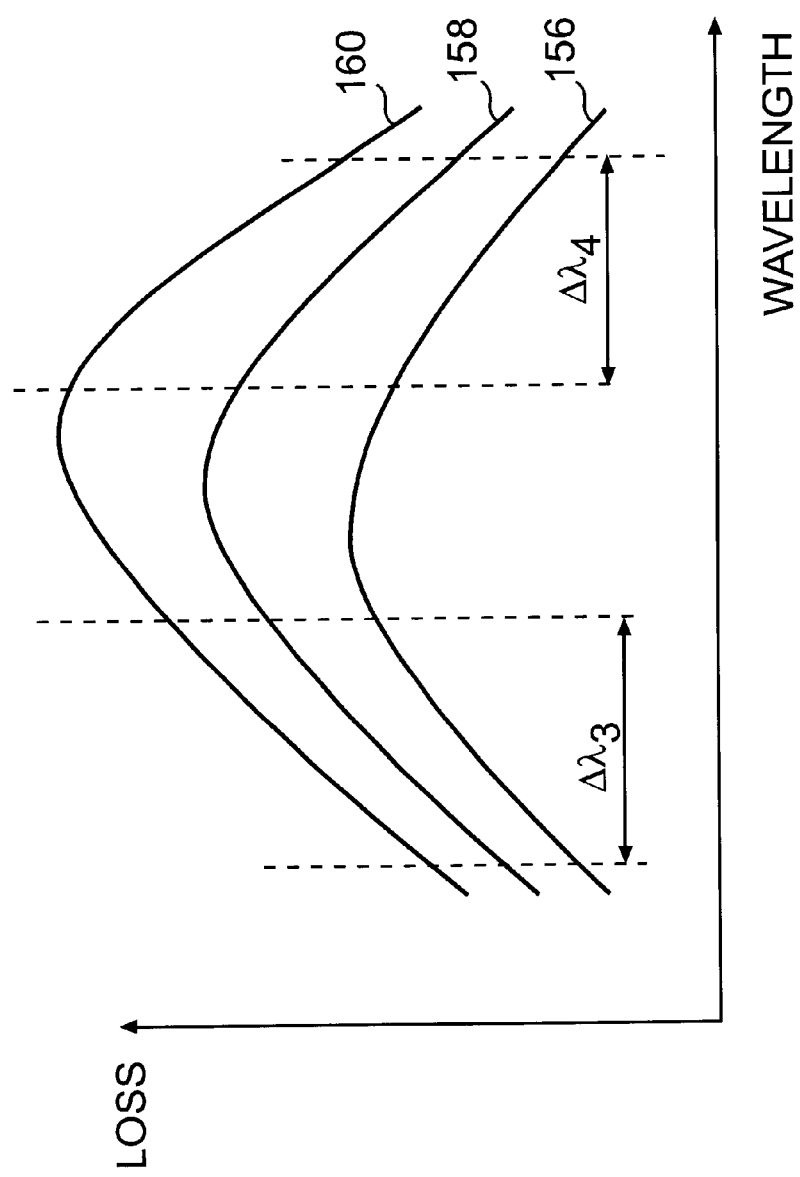
FIG. 5 is a graph of an illustrative loss spectrum for the exemplary dynamic gain adjusting filter of FIG. 3 under reverse biasing conditions.

FIG. 5 illustrates an example of the loss characteristics of a semiconductor optical amplifier 130 in accordance with the present invention. In this example, the loss characteristics of the semiconductor optical amplifier 130, achieved by reverse biasing the active region 140, are used for gain adjusting or to compensate for other gain variations. FIG. 5 shows three loss curves 156, 158, and 160 as a function of wavelength. The loss curves 156, 158, and 160 correspond to different reverse bias voltages $V_1$, $V_2$, and $V_3$ applied across electrodes 144 and 146 of the semiconductor optical amplifier 130. The loss curves 156, 158, and 160 shown in FIG. 5 are generally steeper and cover a narrower range of wavelengths than the gain curves 150, 152, and 154 shown in FIG. 4. This may be achieved by designing the active region 140 of the semiconductor optical amplifier 130 to have a narrower linewidth, for example, by forming the active region of a quantum well structure instead of bulk semiconductor.

In the example shown in FIG. 5, loss curves 156, 158, and 160 each include a wavelength range $\Delta\lambda_3$ in which loss generally increases linearly as wavelength increases. Loss curves 156, 158, and 160 also include a wavelength range $\Delta\lambda_4$ in which loss generally decreases linearly as wavelength increases. The slopes of the generally linear regions vary in curves 156, 158, and 160 as a function of reverse bias voltage. The semiconductor optical amplifier 130 may be designed and driven so that that the one or both of the wavelength ranges $\Delta\lambda_3$ and $\Delta\lambda_4$ cover all or portions of wavelengths used in the transmission of optical signals. By inserting input optical signals into the semiconductor optical amplifier 130 and applying appropriate biasing voltages, the semiconductor optical amplifier 130 can be used to compensate for gain tilt exhibited by optical amplifiers in the transmission path or other sources of gain tilt.

Figure 6:
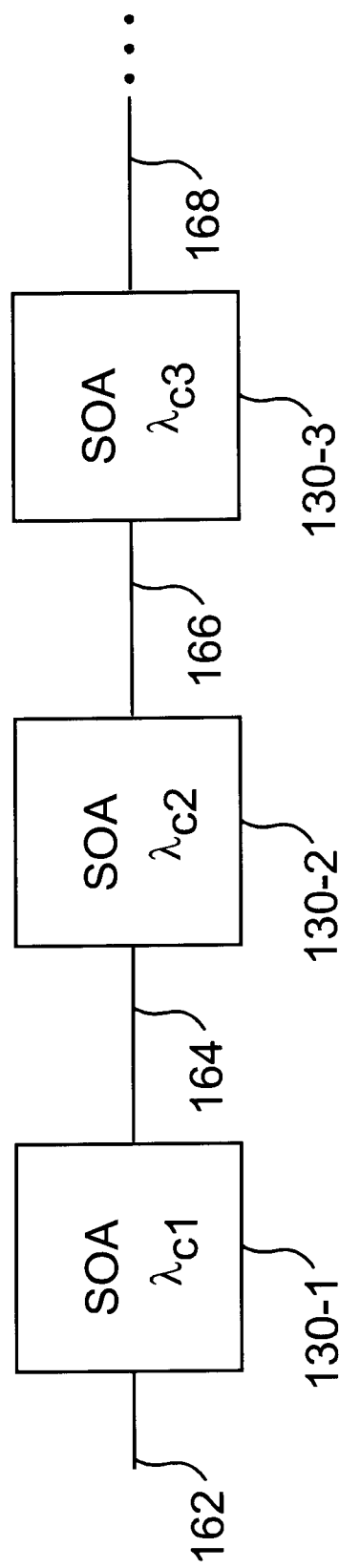
FIG. 6 is a schematic diagram of an exemplary dynamic gain adjusting filter using cascaded semiconductor optical amplifiers in accordance with the present invention.

FIG. 6 illustrates a further embodiment of the present invention. According to FIG. 6, multiple semiconductor optical amplifiers 130-1, 130-2, 130-3, . . . (collectively "semiconductor amplifiers 130") may be connected in series. For example, amplifier 130-1 may receive an optical input signal through input fiber 162. The output of amplifier 130-1 provided as an input to amplifier 130-2 through fiber 164. The output of amplifier 130-2 is provided as an input to amplifier 130-3 through fiber 166. The output of amplifier 130-3 is output through fiber 168 to another semiconductor optical amplifier or to another system component.

The semiconductor optical amplifiers 130-1, 130-2 130-3, . . . may be designed and/or driven to have gain profiles with different peak gain wavelengths $\lambda_{c1}$, $\lambda_{c2}$, $\lambda_{c3}$, . . . , respectively. Each semiconductor optical amplifier 130 will contribute to the overall gain experienced by an optical signal passing through the series arrangement. Accordingly, the semiconductor optical amplifiers 130 can be designed and biased in a way that compensates for ripple, tilt, and other gain variations that may be experienced an optical signal.

While FIG. 6 shows the semiconductor optical amplifiers 130 cascaded without intervening optical devices. It should be understood that one or more optical devices may be interposed between any of the semiconductor amplifiers 130. Moreover, each of the semiconductor optical amplifiers 130 shown in FIG. 6 have a single peak gain wavelength $\lambda_c$. One or more of these semiconductor optical amplifiers may be replaced by a semiconductor optical amplifier having a composite gain profile derived from multiple peak gain wavelengths. Examples of such semiconductor optical amplifiers are described below.

Figure 7:
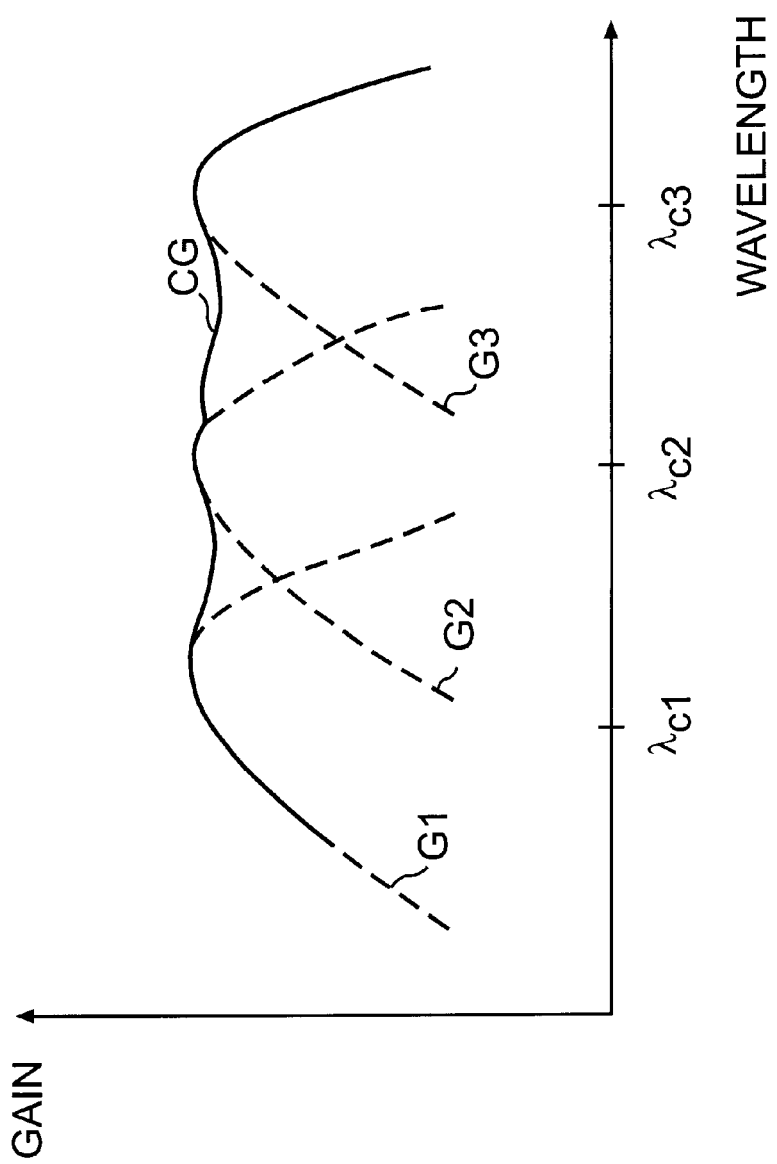
FIG. 7 is a graph of an illustrative gain spectrum for an exemplary dynamic gain adjusting filter in accordance with FIG. 6.

FIG. 7 illustrates an example of the composite gain profile that may be obtained using the semiconductor optical amplifier arrangement illustrated in FIG. 6 with three semiconductor optical amplifiers 130-1, 130-2, and 130-3 having center wavelengths $\lambda_{c1}$, $\lambda_{c2}$, and $\lambda_{c3}$, respectively. FIG. 7 shows each individual gain profile for the three semiconductor optical amplifiers 130-1, 130-2, and 130-3 in dashed lines. The composite gain curve CG of the three semiconductor optical amplifiers 130 is shown as a solid line. As shown, the composite gain curve CG may be relatively flat with only a slight ripple.

The composite gain profile CG may be adjusted, for example, by adjusting the bias voltage applied to one or more of the semiconductor optical amplifiers 130. For example, by decreasing the bias voltage of semiconductor optical amplifier 130-2, the individual gain profile produced by amplifier 130-2 will be reduced. The composite gain profile will, as a result, have a central dip. The composite gain may be used to compensate for ripple, tilt, or other gain variations occurring in the transmission of the optical signals.

Figure 8:
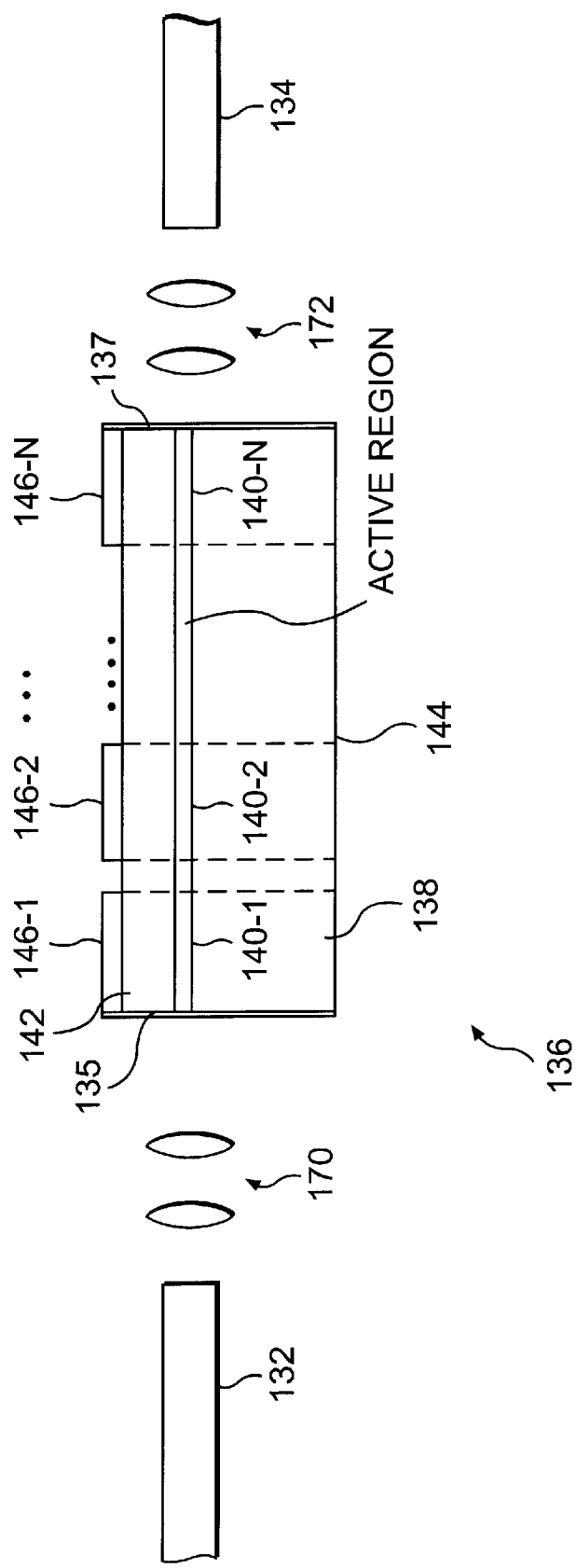
FIG. 8 is a schematic of an illustrative first embodiment of a semiconductor optical amplifier for a dynamic gain adjusting filter in accordance with the present invention.

FIG. 8 illustrates a further embodiment of a semiconductor optical amplifier 130 that provides an additional measure of control compared to the embodiment of FIG. 3. Similar to the embodiment shown in FIG. 3, the semiconductor optical amplifier 130 includes an input fiber 132, an output fiber 134, and a semiconductor optical amplifier device 136 between the input and output fibers. As shown in FIG. 8, lenses 170 are placed between the input fiber 132 and semiconductor optical amplifier device 136 and lenses 172 are placed between the optical amplifier device 136 and the output fiber 134. Lenses 170 focus optical signals output from the facet of input fiber 132 into semiconductor amplifier device 136. Lenses 172 focus optical signals output from the semiconductor amplifier device 136 into output fiber 134. Alternatively, or in addition, the fibers 132 and 134 may include wedge or conical integral fiber lenses. Anti-reflective coatings 135, 137 may be applied to the input and output facets of the semiconductor optical device 136 to reduce coupling losses and gain ripple.

The semiconductor optical amplifier device 136 of FIG. 8 comprises a diode structure having an active region 140 between a p-type (n-type) semiconductor region 138 and a n-type (p-type) semiconductor region 142. The active region 140 may be formed by bulk semiconductor, a quantum well structure having one or more quantum wells, quantum wire, or quantum dots. The active region 140 may be designed, for example, by selection of materials, dimensions, dopants, doping levels, and doping profiles, to achieve the gain (loss) characteristics desired for a particular application. In particular, the active region 140 includes a plurality of subregions 140-1 to 140-N that may be designed to differ in one or more of the characteristics noted above. For example, subregions 140-1 and 140-2 may have different doping levels and/or may be made up of different constituent materials. Consequently, these subregions will produce different optical effects.

An electrode 144 is electrically coupled to semiconductor region 138. Electrodes 146-1 to 146-N are electrically coupled to semiconductor region 142. Electrodes 146-1 to 146-N are spaced apart from each other and potentially may be controlled separately to produce regions of semiconductor optical amplifier device 136 that are biased differently. For example, the voltage difference between electrode 144 and electrode 146-1 produces a current $I_1$, passing through a subregion 140-1 of active region 140 from one semiconductor region 138 to the other semiconductor region 142. Similarly, the voltage differences between electrode 144 and electrodes 146-2 to 146-N produce currents I2 to IN passing through subregions 140-2 to 140-N of active region 140 from one semiconductor region 138 to the other semiconductor region 142.

The semiconductor optical amplifier 130 of FIG. 8 may operate as follows. Selected voltages are applied across electrodes 146-1 to 146-N and electrode 144 to produce currents $I_1$ to $I_N$ through subregions 140-1 to 140-N, respectively. The currents $I_1$ to $I_N$ invert the populations of carriers in their respective subregions 140-1 to 140-N. Lenses 170 focus an input optical signal from the input fiber 132 into the active region 140 of the semiconductor optical amplifier device 136. The input optical signal experiences gain through stimulated emission as it travels through the active region 140. The optical gain profile varies with the design of the subregions 140-1 to 140-N and with the currents $I_1$ to $I_N$. By controlling the bias voltages between electrode 144 and electrodes 146-1 to 146-N, and therefore the currents $I_1$ to $I_N$, the optical gain profile of the semiconductor optical amplifier 130 may be varied. The gain-adjusted optical signal emerges from the end facet of the semiconductor optical amplifier device 136. Lenses 172 focus the gain-adjusted optical signal into the output fiber 134.

According to this embodiment, the provision of multiple electrodes 146-1 to 146-N enables different bias voltages to be applied across a single active region. As a result, a series of currents $I_1$ to $I_N$, which may be different, may be set up through different subregions of the active region 140. As the input optical signal passes through the active region 140, the different subregions impart different gain characteristics to the input optical signal. This embodiment, therefore, provides an additional measure of control over gain while reducing coupling losses that may otherwise be needed to achieve a comparable degree of gain control.

Figure 9:
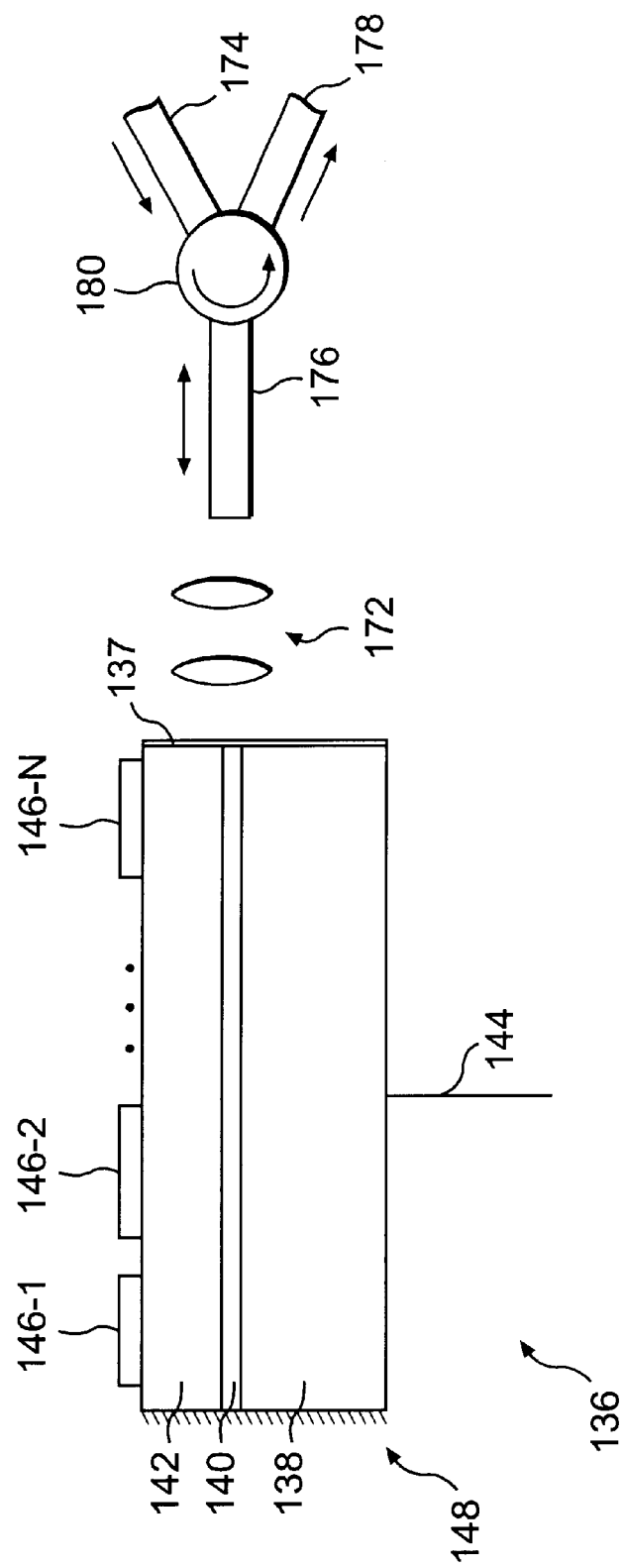
FIG. 9 is a schematic of an illustrative second embodiment of a semiconductor optical amplifier for a dynamic gain adjusting filter in accordance with the present invention.

FIG. 9 illustrates a further variation of the dynamic gain adjusting filter 120. The semiconductor optical amplifier device 136 is similar to that shown in FIG. 8, except that an anti-reflective coating 137 is applied to only one facet of the semiconductor optical amplifier device 136. Another facet of the semiconductor optical amplifier device 136 may have a reflective or partially reflective surface 148.

An input fiber 174 couples an input optical signal to circulator 180. The circulator 180 couples the input optical signal to fiber 176. Fiber 176 directs the input optical signal to lens 172, which inserts the input optical signal into the active region 140 of the semiconductor optical amplifier device 136. The input optical signal experiences gain as it passes from one end of the active region 140 to the other (right to left, as illustrated in FIG. 9). Surface 148 reflects at least part of the optical signal back through the active region 140 (right to left, as illustrated in FIG. 9). As the optical signal travels back through the active region 140, it experiences additional gain. Consequently, the input optical signal experiences gain as it passes forward through the active region 140 and again as its passes backward through the active region 140 after being reflected. The gain is dependent on the design of the semiconductor optical amplifier device 136 and on the voltages applied across electrode 144 and electrodes 146-1 to 146-N.

The gain-adjusted optical signal passes out of the active region 140 and is focused by lenses 172 into fiber 176. The gain-adjusted light passes through fiber 176 into the circulator 180. Circulator 180 couples the gain adjusted light to output fiber 178. Accordingly, input optical signals applied through input fiber 174 may be gain adjusted by the semiconductor optical amplifier device 136 and output to output fiber 178.

Figure 10:
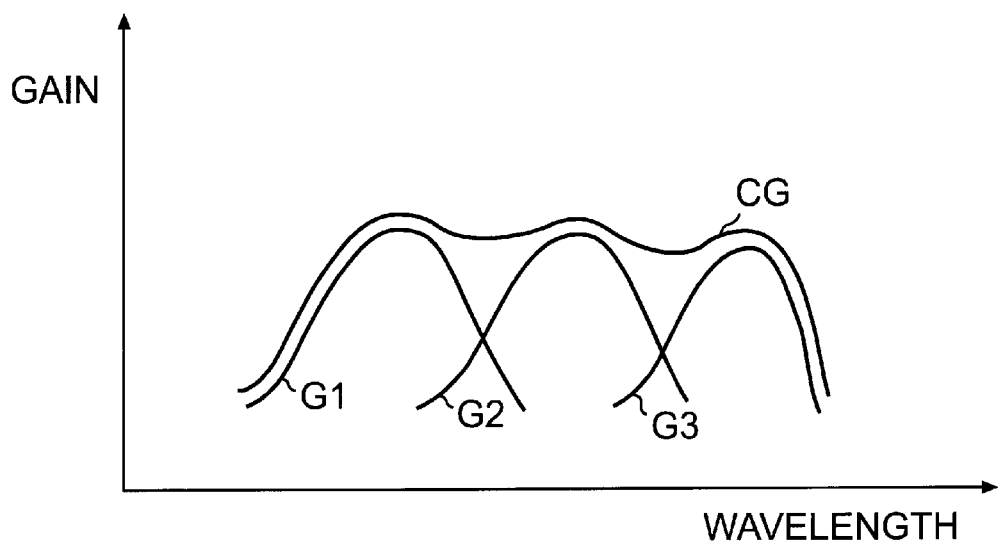
FIG. 10 is a graph of an illustrative gain spectrum for an exemplary dynamic gain adjusting filter in accordance with FIGS. 8 and 9 under a first set of biasing conditions.
Figure 11:
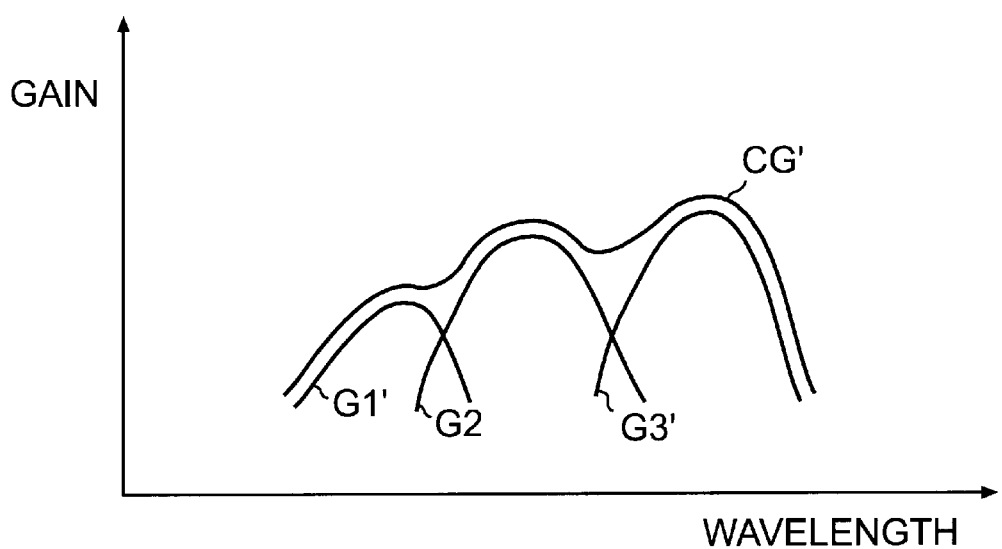
FIG. 11 is a graph of an illustrative gain spectrum for an exemplary dynamic gain adjusting filter in accordance with FIGS. 8 and 9 under a second set of biasing conditions.
Figure 12:
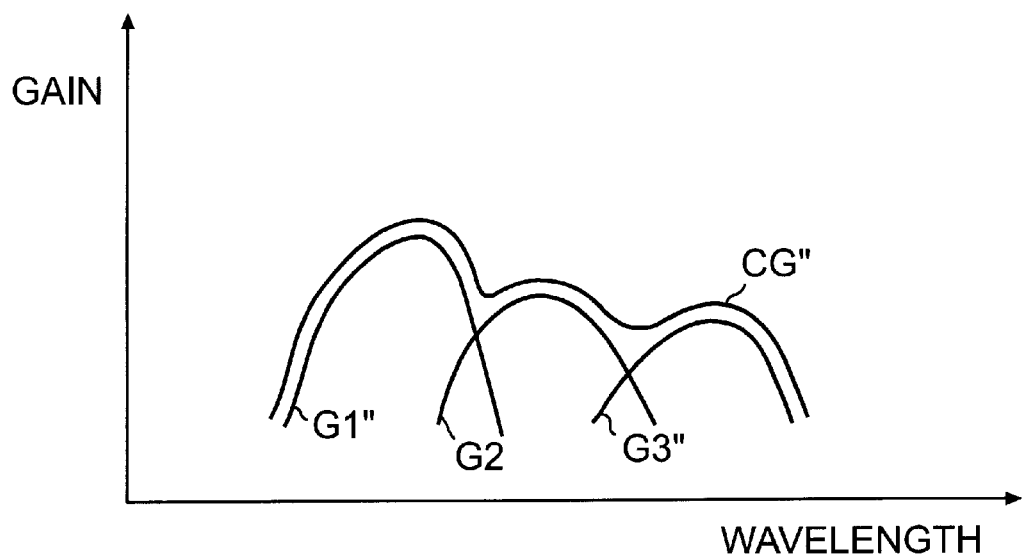
FIG. 12 is a graph of an illustrative gain spectrum for an exemplary dynamic gain adjusting filter in accordance with FIGS. 8 and 9 under a third set of biasing conditions.

FIGS. 10–12 illustrate the control of the composite gain profile of an exemplary semiconductor optical amplifier embodiment of the type shown in FIGS. 8 or 9. In the examples of FIGS. 10–12, the semiconductor optical amplifier device 136 includes three electrodes 146-1, 146-2, and 146-3.

With respect to FIG. 10, the bias voltage applied between electrodes 146-1 and 144 produces a current $I_1$ through a subregion 140-1 of active region 140 located between electrodes 146-1 and 144. The result is a gain profile G1. Similarly, the bias voltages between electrodes 146-2 and 144 and electrodes 146-3 and 144 produce currents I2 and I3 through subregions of active region 140 located between electrodes 146-2 and 144 and electrodes 146-3 and 144, respectively. Gain profiles G2 and G3 are produced. Each of gain profiles G1, G2, and G3 contribute to the composite gain CG experienced by an optical signal passing through active region 140. As shown in the example of FIG. 10, the composite gain CG experienced by an input optical signal passing through the active region 140 is relatively flat.

FIG. 11 provides a further example in which the bias voltage applied between electrodes 146-1 and 144 is reduced and the bias voltage between electrodes 146-3 and 144 is increased. As a result, the current passing through the portion of the active region 140 between electrodes 146-1 and 144 is reduced to $I'_1$. An optical signal passing through the active region between electrodes 146-1 and 144 experiences reduced gain, as shown by gain profile G1'. The bias voltage applied between electrodes 146-2 and 144 remains unchanged and produces a gain profile G2. The increased bias voltage between electrodes 146-3 and 144 results in a corresponding increase in the current $I'_3$ passing through the active region 140 between these electrodes. The gain profile G3' reflects the increased current $I'_3$. The composite gain CG' shown in FIG. 11 exhibits a generally linear profile with a positive slope.

FIG. 12 provides yet a further example in which the bias voltage applied between electrodes 146-1 and 144 is increased to produce a gain profile G1". The bias voltage applied between electrodes 146-2 and 144 remains unchanged and produces a gain profile G2. The bias voltage between electrodes 146-3 and 144 is reduced to produce a gain profile G3". As a result, the composite gain CG" shown in FIG. 12 exhibits a generally linear profile with negative slope.

As shown by FIGS. 10–12, the gain characteristics of semiconductor optical amplifier 130 may be adjusted by varying the bias across electrodes 146-1 to 146-3 and electrode 144 to produce a positive sloping composite gain, a negative sloping composite gain, and flat composite gain. The same or similar results may be achieved using two or more electrodes 146. The semiconductor optical amplifier 130 may be used, for example, as a dynamic gain tilt controller to compensate for gain tilt in an optical signal or as a dynamic gain adjusting filter to compensate for other gain variations that may otherwise be produced.

Figure 13:
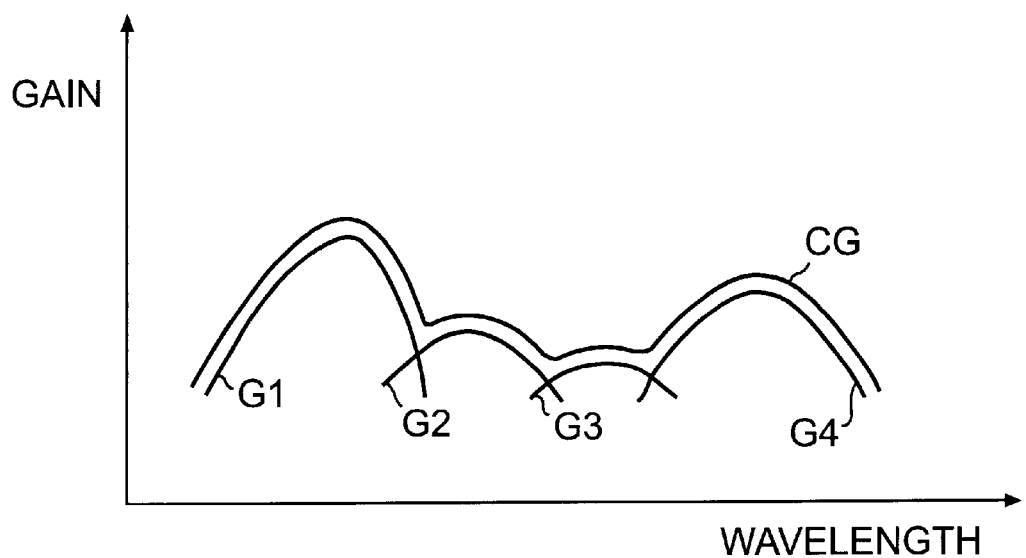
FIG. 13 is a graph of an illustrative gain spectrum for an exemplary dynamic gain adjusting filter in accordance with FIGS. 8 and 9 under a fourth set of biasing conditions.

Of course, the semiconductor optical amplifier 130 may be controlled to produce arbitrary gain characteristics. FIG. 13 illustrates an example. In the example of FIG. 13, the semiconductor optical amplifier device 136 includes four electrodes 146-1, 146-2, 146-3, and 146-4. In this example, the bias voltage applied between electrodes 146-1 and 144 is set to produce a gain profile G1. Similarly, the bias voltages between electrodes 146-2 and 144, electrodes 146-3 and 144, and electrodes 146-4 and 144 are set to produce gain profiles G2, G3 and G4, respectively, as shown in FIG. 13. The composite gain CG experienced by an input signal passing through the active region is shown as CG in FIG. 13. As shown in FIG. 13, the composite gain CG may be controlled to exhibit any arbitrary gain profile.

Figure 14:
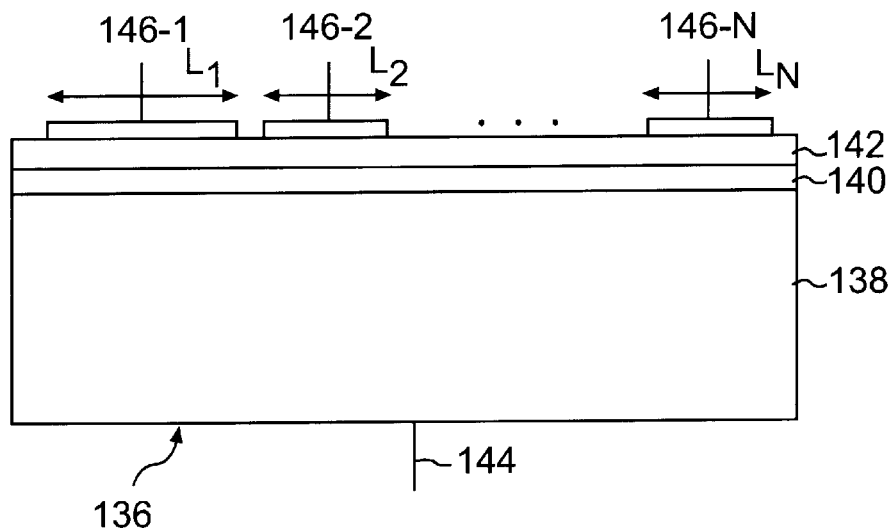
FIG. 14 is a schematic of an illustrative third embodiment of a semiconductor optical amplifier for a dynamic gain adjusting filter in accordance with the present invention.

FIG. 14 illustrates a further embodiment of a semiconductor optical amplifier device 136. Similar to the embodiment illustrated in FIG. 9, the semiconductor optical amplifier device 136 includes an n-type (p-type) semiconductor region 138, an active region 140, and a p-type (n-type) semiconductor region 142. An electrode 144 is electrically connected to semiconductor region 138. Multiple electrodes 146-1 to 146-N are electrically connected to the semiconductor region 142. Electrodes 146-1 to 146-N are spaced apart from each other and may be controlled separately in some embodiments.

The area A of at least some of electrodes 146-1 to 146-N may differ from each other. In the example of FIG. 14, each of the electrodes 146-1 to 146-N has a dimension W. A further dimension L of the electrodes 146-1 to 146-N may differ. For example, electrode 146-1 has a dimensions W, L1 and electrode 146-2 has dimensions W, L2, where L1 that differs from L2. For the sake of convenience, it is assumed that L1 is twice L2 in the example that follows. It should be understood that area of an electrode 146 may be varied in any one or more dimensions along the surface of semiconductor region 142.

Figure 15:
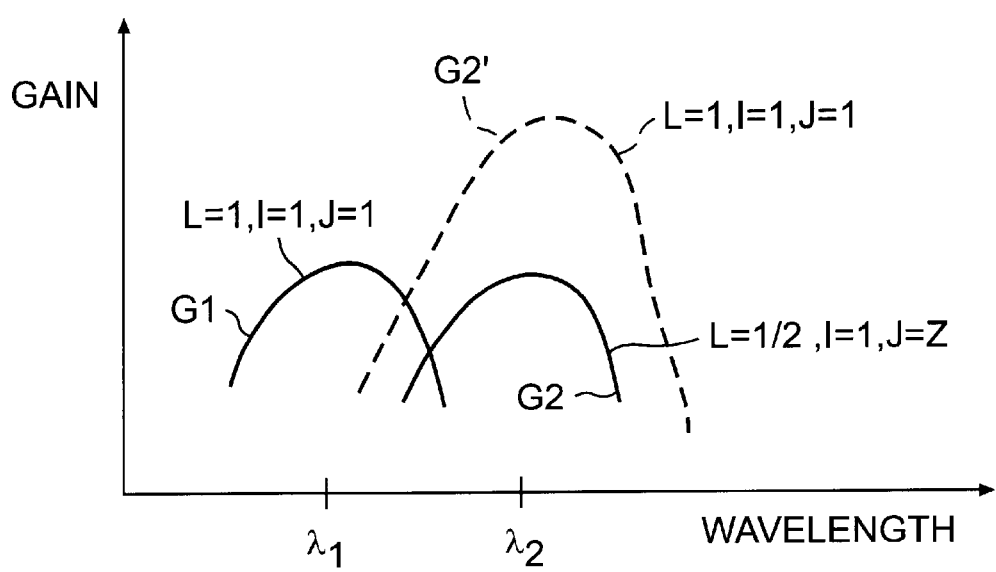
FIG. 15 is a graph of an illustrative gain spectrum for an exemplary dynamic gain adjusting filter in accordance with FIGS. 14.

FIG. 15 illustrates the effect of the dimensions of electrodes 146 on gain. The gain produced by a given subregion 140-1 of active region 140 is proportional to the current flow through that subregion. The current flow through a subregion, all else being equal, is determined by the geometry of the electrodes 146 and 144 sandwiching subregion. In FIG. 15, a first gain curve G1 corresponds to the subregion 140-1 of active region 140, which is controlled by electrode 146-1. FIG. 15 shows gain curve G1 having a peak gain wavelength $\lambda_2$ and a peak gain value $G_{max1}$. A second gain curve G2 corresponds to subregion 140-2 of active region 140, which is controlled by electrode 146-2. Gain curve G2 has a peak gain wavelength $\lambda_2$ and a peak gain value $G_{max2}$.

When the same current I=1 flows through subregions 140-1 and 140-2, the peak gains $G_{max1}$, and $G_{max2}$ of gain curves G1 and G2 are about the same. However, in order to produce the same current I, the current density J through subregion 140-2 must be about twice the current density through subregion 140-1. This is because the area of subregion 140-2 is about twice as small as the area of subregion 140-1. A greater voltage must be applied to electrode 146-2 in order to produce the increased current density J. Gain curve G2' illustrates the effect if that same voltage were applied to an electrode 146-2 having the same dimensions as electrode 146-1. As shown, the greater voltage produces a greater peak gain $G'_{max2}$. As should be clear from FIGS. 14 and 15, adjusting the dimensions of electrodes 146-1 to 146-N provides further control of composite gain profile that may be produced by semiconductor optical amplifier device 136.

Figure 16:
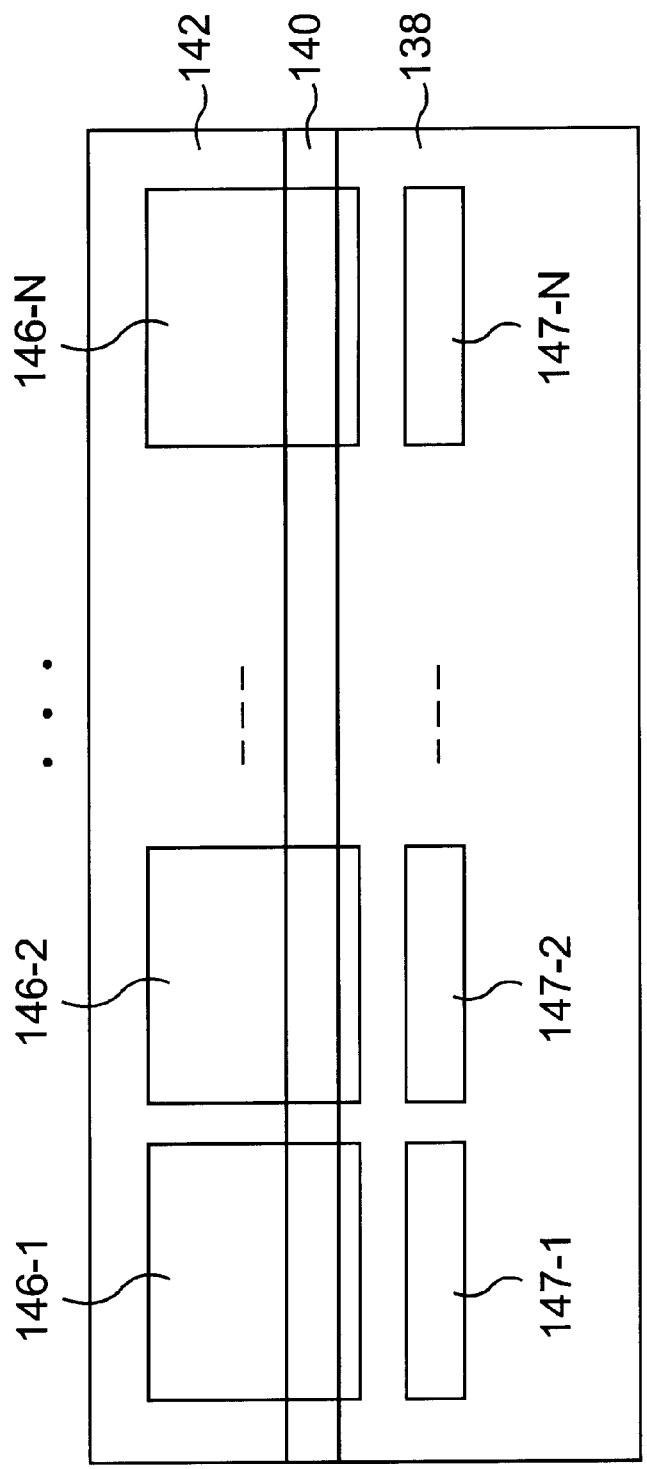
FIG. 16 is a schematic of an illustrative fourth embodiment of a semiconductor optical amplifier for a dynamic gain adjusting filter in accordance with the present invention.

FIG. 16 illustrates a further embodiment of semiconductor optical amplifier device 136. As shown in FIG. 16, an active region 140 is formed between an n-type (p-type) semiconductor region 138 and a p-type (n-type) semiconductor region 142. A plurality of electrodes 146-1 to 146-N are formed in electrical contact with semiconductor region 142.

As shown. in FIG. 16, a plurality of heater elements 147-1 to 147-N may be applied at or near the surface of the semiconductor optical amplifier device 136. The heater elements 147-1 to 147-N may be, for example, integral thin film heaters. As shown in FIG. 16, the heater elements 147-1 to 147-N may be located adjacent to electrodes 146-1 to 146-N, respectively. Electrode 144 (not shown) may be provided opposite electrodes 146-1 to 146-N. Heater elements 147-1 to 147-N preferably are individually controllable to change the temperature of the semiconductor material near the electrodes 146-1 to 146-N. For example, the heater element 147-1 may be controlled to change the temperature of the semiconductor material between electrode 146-1 and electrode 144. The change in temperature shifts the peak gain wavelength of optical signals passing through the portion of the active region 140 between the electrodes 146-1 and 144. Similarly, heater elements 147-2 to 147-N may be selectively controlled to shift the peak gain wavelength experienced by optical signals travelling through the active region 140.

As shown in FIG. 16, there is a one-to-one relationship between the electrodes 146-1 to 146-N and the heater elements 147-1 to 147-N. However, this is not required. Heater elements 147 may correspond to groups of electrodes 146. Further, heater elements 147 may not be provided for some electrodes 146.

Figure 17:
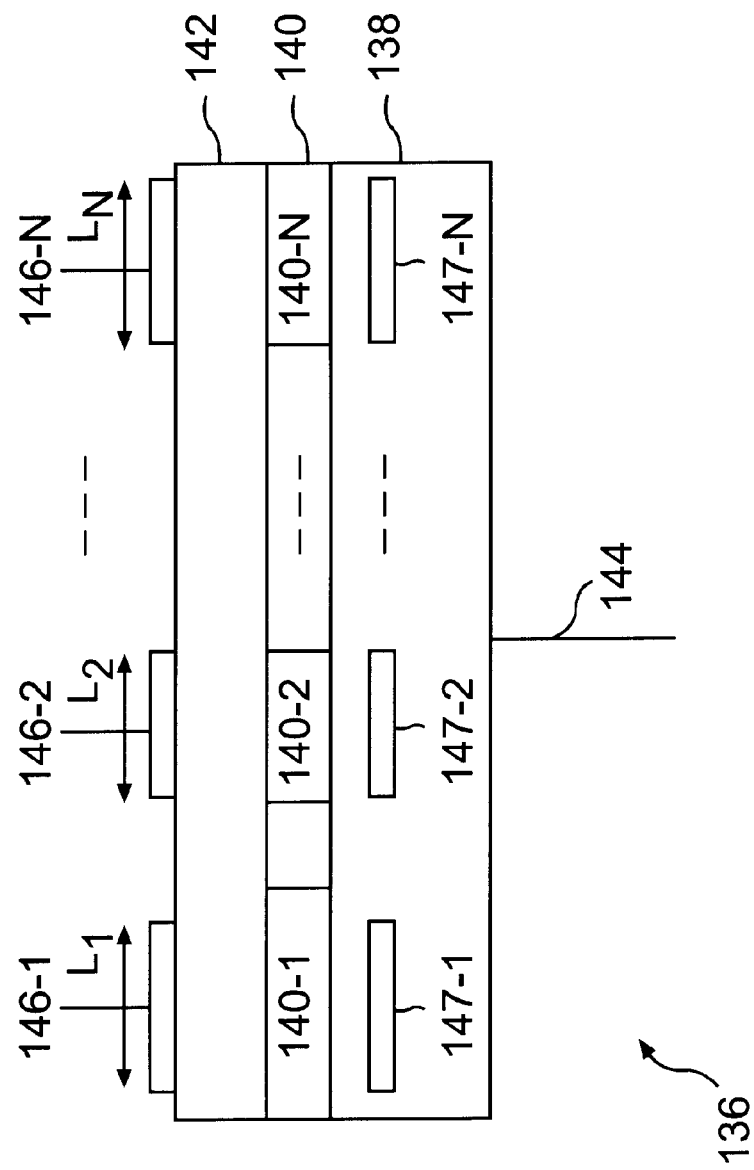
FIG. 17 is a schematic of an illustrative fifth embodiment of a semiconductor optical amplifier for a dynamic gain adjusting filter in accordance with the present invention.

FIG. 17 illustrates a further embodiment of a semiconductor optical amplifier device 136. In accordance with FIG. 16, the semiconductor optical amplifier device 136 includes an active region 140 with a plurality of subregions 140-1 to 140-N sandwiched between an n-type (p-type) semiconductor region 138 and a p-type (n-type) semiconductor region 142. Subregions 140-1 to 140-N may have different physical structures. The different structures may be the result of, among other things, different materials, different ratios of constituent materials, different number of layers, different doping concentrations, different dimensions (e.g., different lengths, different ridge widths through which light passes, etc.), different bias current, different strain, different thickness and size, different active region structures (e.g., bulk, quantum wells, quantum wires, and quantum dots) or combinations thereof. The different structures may be designed to yield different gain characteristics, such as peak gain wavelength and/or linewidth. For example, subregion 140-1 and subregion 140-2 may have different quantum well structures with different material layers, like GaAsInP and GaAlInAs, or different compositions like $Ga_xAs_yIn_zP_k$ with different parameters x, y, z, and k.

The semiconductor optical device 136 further includes an electrode 144 electrically coupled to semiconductor region 138 and a plurality of electrodes 146-1 to 146-N electrically coupled to semiconductor region 142. Electrodes 146-1 to 146-N are generally aligned with subregions 140-1 to 140-N, respectively, to control the bias voltage across the active regions. The areas of at least two of electrodes 146-1 to 146-N may be different. In addition, the one or more heater elements 147-1 to 147-N may be provided beside the contact electrodes 146-1 to 146-N.

In operation, electrodes 146-1 to 146-N and electrode 144 are driven to apply bias voltages across subregions 140-1 to 140-N. Optical signals travelling through the subregions 140-1 to 140-N experience gain through stimulated emission in accordance with the structure, heating conditions, and biasing conditions applied to subregions 140-1 to 140-N. The embodiment of FIG. 17 is described and shown as having multiple electrodes 146-1 to 146-N. However, a single electrode 146 may be used. If each of subregions 140 have the same structure, the resulting semiconductor optical amplifier device 136 will be similar to that shown in FIG. 3. If multiple different subregions 140-1 to 140-N are provided, the resulting gain profile will be the composite of individual gain profiles of each subregion 140-1 to 140-N.

In FIGS. 8–17 above, the semiconductor optical device 136 has described as having a common electrode 144 electrically coupled to semiconductor region 138. It should be understood, however, that the common electrode 144 may be replaced by a plurality of electrodes 144-1 to 144-K spaced apart and electrically coupled to semiconductor region 138. The number of electrodes 144 does not have to match the number of electrodes 146. Each of the electrodes 144-1 to 144-K may be controlled separately.

As described in above, the composite gain profile of a semiconductor optical amplifier may be tailored by varying design parameters, such as the number of series-connected semiconductor optical amplifier devices, and/or the design of the semiconductor optical amplifier devices, such as the number of electrodes 146, the size of electrodes, and the structure, doping, and material of the semiconductor regions. In addition, the composite gain profile produced by a semiconductor optical amplifier may be dynamically adjusted according to several techniques, including varying the bias voltage and the temperature of the active region. The silicon optical amplifiers described above can produce satisfactory gain compensation when operated in the unsaturated or slightly saturated regions, which also serves to avoid or reduce signal crosstalk. Of course, the composite gain profile of a semiconductor optical amplifier according to the present invention may be designed and adjusted by any combination of the above expedients.

Figure 18:
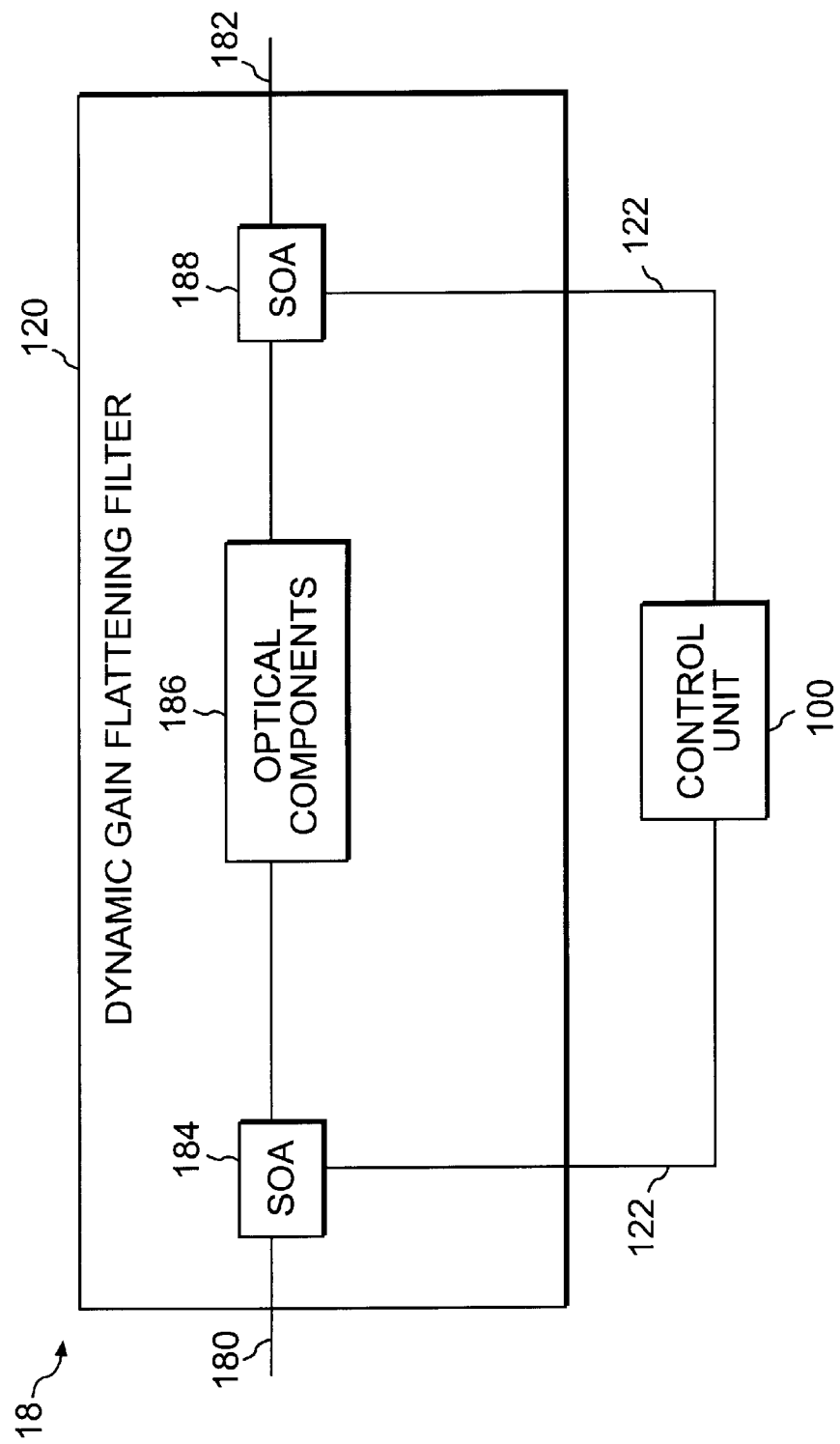
FIG. 18 is a schematic of an illustrative dynamic gain adjusting filter with control unit in accordance with the present invention.

FIG. 18 illustrates a further arrangement of a dynamic gain adjusting filter 120 according to the present invention. The arrangement of FIG. 18 may be implemented as an optical device 18 itself or as a component part of a larger optical device 18. As shown in FIG. 18, a dynamic gain adjusting filter 120 is coupled between an input optical fiber 180 and an output optical fiber 182. The dynamic gain adjusting filter 120 may include a first semiconductor optical amplifier 184, optical components 186, and a second semiconductor optical amplifier 188.

The first semiconductor optical amplifier 184 receives an input optical signal from input fiber 180 and supplies a gain-adjusted optical signal to optical components 186. Second semiconductor optical amplifier 188 receives an input optical signal from optical components 186 and supplies a gain adjusted output signal to output fiber 182. The first and second semiconductor optical amplifiers 184 and 188 may be controlled using control signals provided by control unit 100 over links 122. The control signals, for example, may control the bias voltages applied to electrodes of the semiconductor optical amplifiers 184 and 188 and or heater elements.

The semiconductor optical amplifiers 184 and 188 may be built according to the embodiments shown in FIGS. 3, 6, 8, 9, 14, 16, or 17, for example, or according to another suitable design. Optical components 186 may be a single optical component or a combination of optical components. For example, optical components 186 may be an add/drop module, an amplifier arrangement, switching components, a router, a wavelength converter, an optical monitor, one or more dispersion compensation devices, a gain equalization filter, or other optical passive or active components, or a combination or combinations of the foregoing. In accordance with this arrangement, the gain of an input optical signal may be adjusted by the first semiconductor optical amplifier 184 before it is applied to optical components 186. In addition, the gain of optical signals from optical components 184 may be adjusted using the second semiconductor optical amplifier 188 before being applied to output fiber 182.

FIG. 19 provides a schematic of a gain adjusting arrangement including both a gain equalization filter 192 and a dynamic gain adjusting filter 196 in accordance with the present invention. The gain adjusting arrangement of FIG. 19 may be provided as a separate module or as part of a larger module. As shown in FIG. 19, an optical input signal may be provided to the gain equalization filter 192 by an input fiber 190 or other suitable means. The gain equalization filter 192 may be, for example, a variable optical attenuator, wavelength-dependent optical filter (e.g., based on a thin film device, fiber grating, etc.), or other passive device, or a dynamic gain equalization filter based on MEMS, liquid crystal, fused fiber, planar waveguide, or other technologies.

The gain equalization filter 192 provides an output to dynamic gain adjusting filter 196. The output optical signal from the gain equalization filter 192 may be supplied via a fiber 194 or other suitable waveguide. For example, a planar waveguide may be used if the gain equalization filter 192 and the dynamic gain adjusting filter 196 are provided on the same substrate. The dynamic gain adjusting filter 196 may be embodied as a semiconductor optical amplifier 130, such as described above, or by another design. The output of the dynamic gain adjusting filter 196 may be provided to an output fiber 198.

In accordance with the embodiment shown in FIG. 19, the gain experienced by an input optical signal will be a composite of the gain profiles of the gain equalization filter 192 and the dynamic gain adjusting filter 196. This arrangement provides a further measure of control over the composite gain profile. For example, the gain equalization filter 192 may provide a baseline attenuation spectrum, whereas the dynamic gain adjusting filter 196 may provide a differential gain and/or attenuation spectrum. The differential gain or loss depends on the biasing voltage of the semiconductor optical amplifier(s) of the dynamic gain adjusting filter 196. Moreover, because the dynamic gain adjusting filter 196 can provide positive gain, the embodiment of FIG. 19 may provide an improved noise figure over conventional arrangements. While FIG. 19 shows the gain equalization filter 190 providing an input to the dynamic gain adjusting filter 192, it should be understood that the order may be reversed.

FIG. 20 provides a schematic of a further gain adjusting arrangement having both a gain equalization filter 192 and a dynamic gain adjusting filter 196 in accordance with the present invention. As shown in FIG. 20, input fiber 190 supplies an optical input signal to a first optical amplifier 200. The output of the first amplifier 200 may be supplied to the gain equalization filter 192. The gain equalization filter 192 provides an output to a second optical amplifier 202. The output of the second amplifier 202 may be supplied to dynamic gain adjusting filter 196. The output of the dynamic gain adjusting filter 196 may be provided to a third optical amplifier 204. The output of the third amplifier 204 is supplied to output fiber 198.

As shown in FIG. 20, amplifiers 200, 202, and 204 may be provided before, after, and between the gain equalization filter 192 and the dynamic gain equalization filter 196. Similar to FIG. 19, variations in the gain of the optical amplifiers 200, 202, and 204 may be compensated using the combined gain profiles of the gain equalization filter 192 and the dynamic gain adjusting filter 196. The amplifiers 200, 202, and 204 may be rare earth-doped fiber amplifiers, such as erbium-doped fiber amplifiers, Raman amplifiers, parametric amplifiers, or semiconductor optical amplifiers. Moreover, one or more of the amplifiers 200, 202, and 204 may be omitted or replaced by other optical equipment.

Any one or more of amplifiers 200, 202, and 204 may be multi-stage amplifiers or amplifier modules including optical devices in addition to the amplifier. Alternatively, the amplifiers 200, 202, and 204 together with gain equalization filter 192 and dynamic gain equalization filter 192, and possibly other optical equipment, may constitute a single optical module.

Figure 21:
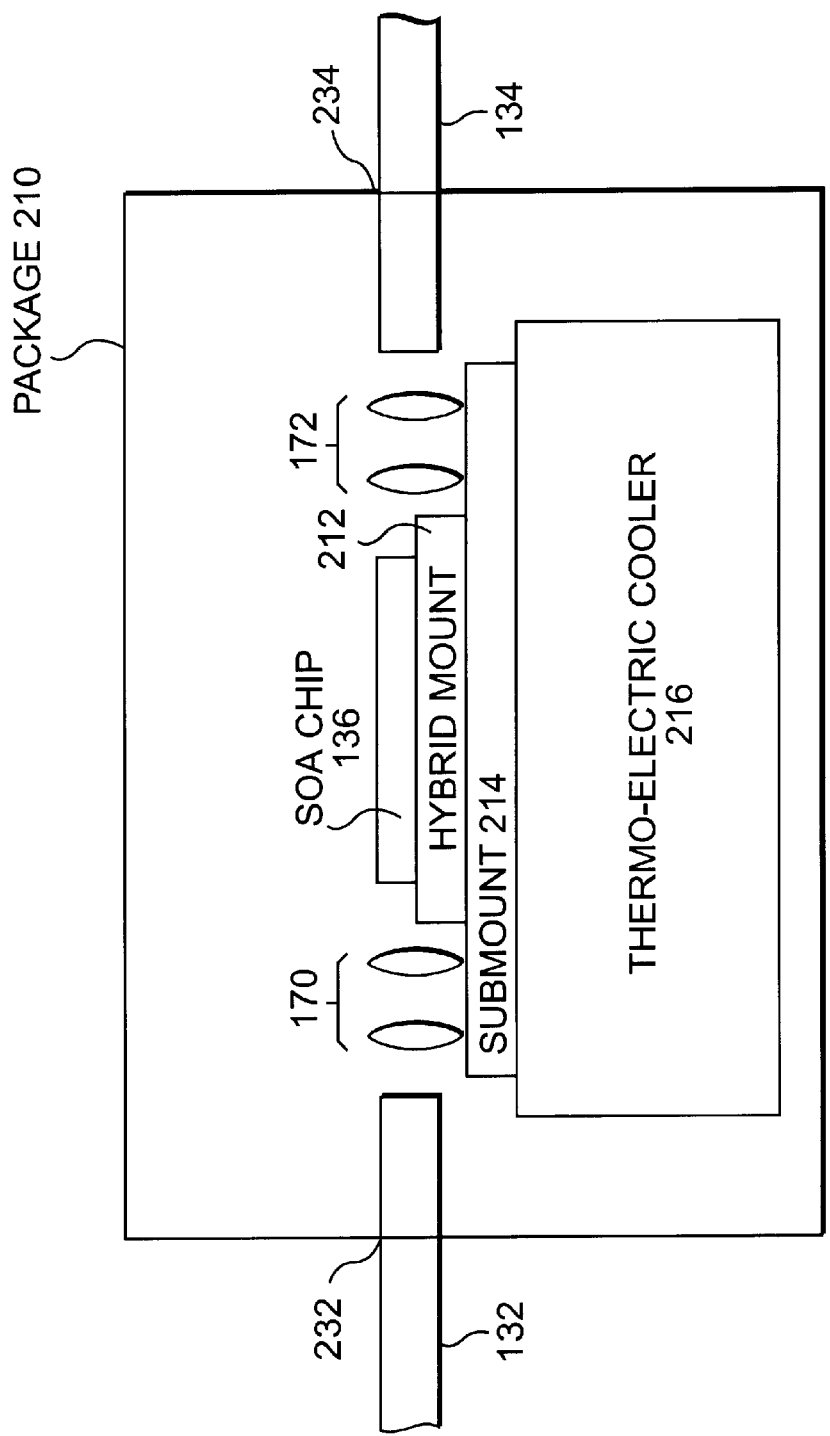
FIG. 21 provides a first exemplary arrangement for packaging a semiconductor optical amplifier in accordance with the present invention.
Figure 22:
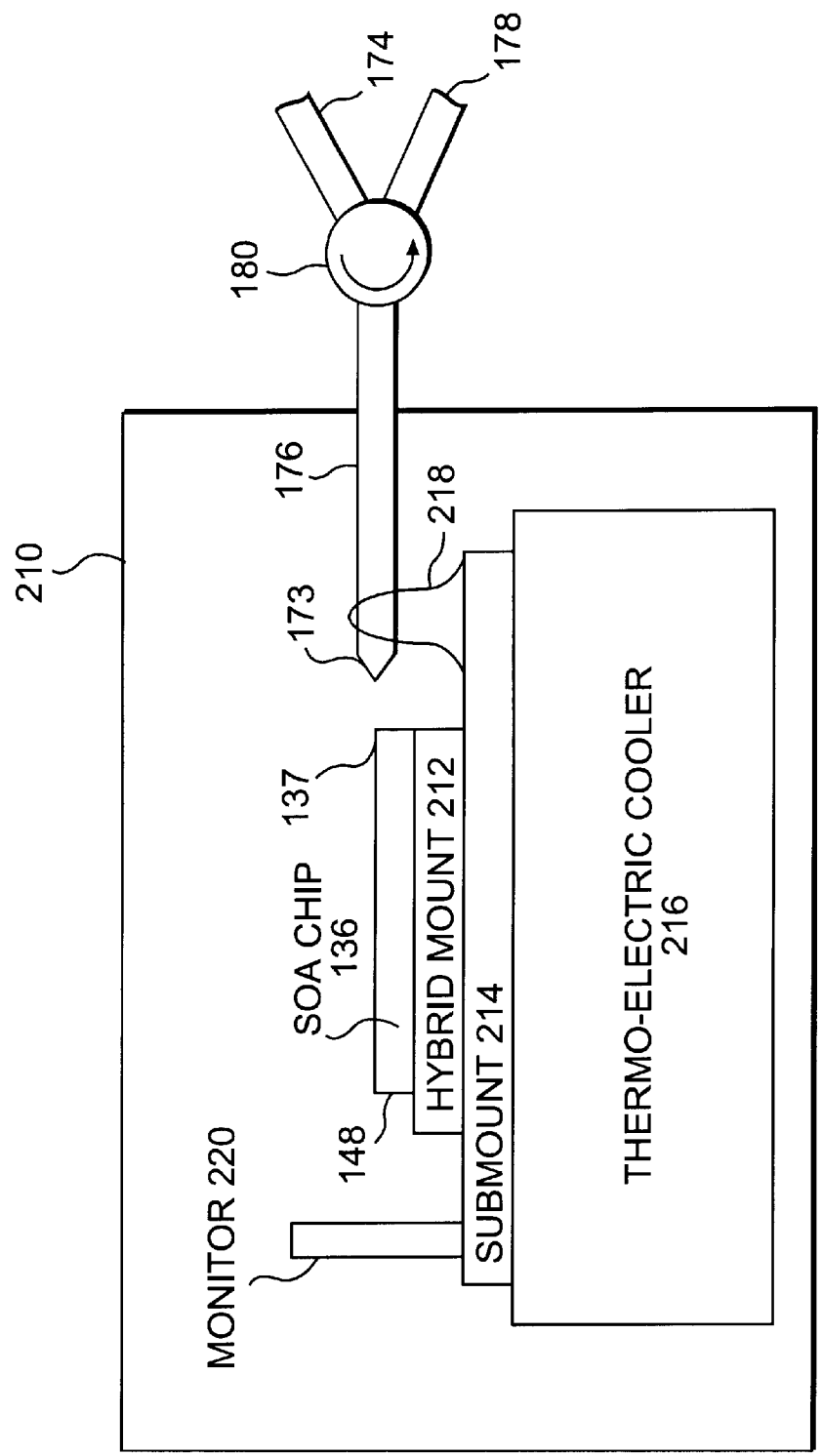
FIG. 22 provides a second exemplary arrangement for packaging a semiconductor optical amplifier in accordance with the present invention.

FIGS. 21 and 22 illustrate packaging arrangements that may be used to house the semiconductor optical amplifier 130 according to the present invention. A first packaging arrangement shown in FIG. 21 includes a package housing 210. The package housing 210 includes apertures 232 and 234 through which input fiber 132 and output fiber 134, respectively, extend. The package housing 210 may include additional apertures through which electrical leads for control and power may extend.

The semiconductor optical amplifier device 136 is housed within package housing 210. The package housing 210 is preferably hermetically sealed to protect the semiconductor optical amplifier device 136 from the environment. The semiconductor amplifier device 136 is mounted to a hybrid mount 212. The hybrid mount 212 may be formed of a material having the same or similar thermal coefficient of expansion as the semiconductor optical amplifier device 136. This reduces mechanical stresses and maintains a strong physical coupling between the semiconductor optical amplifier device 136 and the hybrid mount 212 over a range of operating temperatures. The material of the hybrid mount 212 may also be selected for high thermal conductivity and/or low electrical conductivity. Exemplary materials are SiC, AlN, BeO, or Si.

The hybrid mount 212 is mounted to a submount 214. The submount 214 may also be used to support lenses 170 and 172. Lenses 170 are positioned adjacent the facet of input fiber 132 to direct optical signals emitted from the input fiber 132 into the active region of the semiconductor optical amplifier device 136. Lenses 172 are positioned to direct optical signals from the active region of the semiconductor optical amplifier device 136 into the facet of the output fiber 134.

Submount 214 may further include electrical elements, such as protection diodes, a temperature sensor, and bonding pads and traces. The bonding pads and traces may be used to couple electrical signals to and from the semiconductor optical amplifier device 136, e.g., for driving electrodes and/or heating elements. Protection diodes may be provided in the current path to the semiconductor optical amplifier device 136. The protection diodes may be used to protect the semiconductor optical amplifier device 136 from voltage spikes or other transients that may cause damage or impair device operation. A temperature sensor may be used to monitor the interior temperature of package housing 210 and supply the temperature signal to equipment outside the package housing 210. Submount 214 is mounted to a thermal electric cooler 216. The thermal electric cooler 216 may be used to maintain a stable operating temperature during device operation.

FIG. 22 illustrates a further embodiment of a packaging arrangement for housing semiconductor optical amplifier device 136. The packaging arrangement may be useful for the embodiment shown in FIG. 9. As shown in FIG. 22, the packaging arrangement includes a package housing 210. The package housing 210 includes an aperture that receives fiber 176. A first end of fiber 176 extends outside of package housing 210 and couples to circulator 180. The circulator 180 also couples to input fiber 174 and output fiber 178.

Within the package housing 210, the semiconductor optical amplifier device 136 mounts to hybrid mount 212. The semiconductor optical amplifier device 136 may include a first facet having an antireflective coating 137 and a second facet having a partially reflective surface 148. The material of hybrid mount 212 may be selected as discussed above in connection with FIG. 21. The hybrid mount 212 may be mounted to a submount 214.

A second end of fiber 176 is mounted via a clip 218 to submount 214. The second end of fiber 176 includes a conical or wedge-shaped integrated lens 173. The lens 173 is positioned opposite the antireflective coating 137 of the facet of semiconductor optical amplifier device 136 and held in place by clip 218. As a result, optical signals emitted from lens 173 may be inserted into the active region of semiconductor optical amplifier device 136. Moreover, gain-adjusted optical signals emitted from the active region of semiconductor optical amplifier device 136 may be inserted back into fiber 176 through lens 173.

The submount 214 may include electrical elements as described above in connection with FIG. 21. In addition, a monitor 220 may be mounted on submount 214. Monitor 220 may be positioned opposite the partially reflective surface 148 of semiconductor optical amplifier device 136. The monitor 220 may be used to monitor optical signals from the semiconductor optical amplifier device 136. The monitor 220 may be an optical detector, for example, a PIN diode, an array of PIN diodes, a charged-coupled device, or other optical detector. The monitor 220 may be spectral detector, including an optical detector and a wavelength dispersive device, such as a prism or grating. Alternatively, the wavelength dispersive device may be provided between monitor 220 and semiconductor optical amplifier device 136.

Submount 214 is mounted to a thermal electric cooler 216. The thermal electric cooler 216 may be used to maintain a stable operating temperature during device operation.

In operation, input fiber 174 supplies input optical signals to circulator 180, which couples the input optical signals to fiber 176. Lens 173 couples the input optical signals from fiber 176 into the semiconductor optical amplifier device 136 through antireflective coating 137. As the optical signals pass from one facet of semiconductor optical amplifier device 136 to another, they experience gain in accordance with the design, driving conditions, and temperature conditions of semiconductor optical amplifier 136.

A first portion of the optical signals reaching partially reflective surface 148 are reflected back through the semiconductor optical device 136, where they again experience gain. The gain-adjusted optical signals emitted from the facet of semiconductor optical amplifier 136 are directed back into fiber 176 by lens 173. The gain-adjusted optical signals pass from fiber 176 into circulator 180 and are coupled to output fiber 178.

Some optical signals reaching partially reflective surface 148 are emitted from semiconductor optical amplifier device 136. The monitor 220 detects the emitted optical signals to produce electrical signals. The electrical signals may be supplied to a control unit (not shown) either within or outside of package housing 210. The control unit may use the control signals to vary the bias voltages and/or heater elements of the semiconductor optical amplifier 136 to produce the desired gain profile for the gain-adjusted optical signals output to output fiber 178.

Processes for manufacturing the semiconductor optical amplifier device 136 according to the present invention will now be described. As described in connection with FIG. 17, the semiconductor optical amplifier device 136 may be formed with multiple different active subregions 140-1 to 140-N. The different subregions 140-1 to 140-N may be designed to yield different gain characteristics. For example, different subregions 140-1 to 140-N may be designed to produce different peak gain wavelengths under the same biasing conditions and/or different linewidths.

Figure 23:
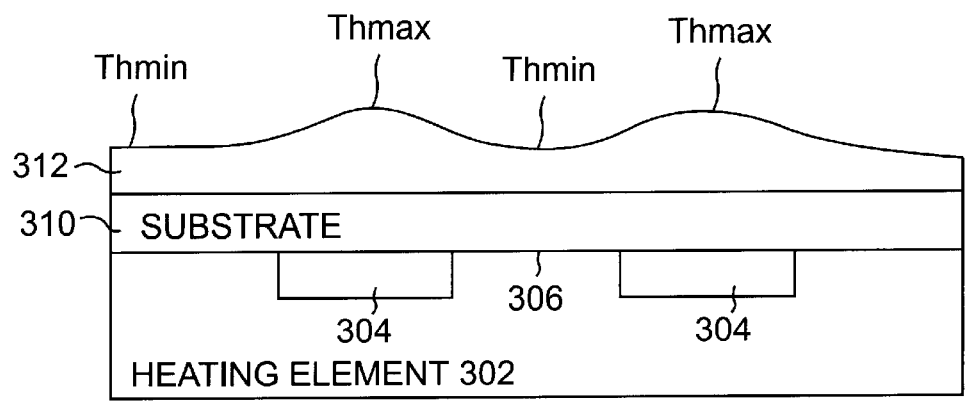
FIG. 23 illustrates a first exemplary technique for obtaining preferential deposition of material for a semiconductor optical amplifier in accordance with the present invention.

The different active regions 140-1 to 140-N may be formed using preferential growth and etching techniques. For example, preferential growth can occur during deposition if the deposition rate is temperature dependent and the semiconductor substrate is selectively heated. FIG. 23 illustrates an embodiment for producing preferential growth by selective heating of the semiconductor substrate. As shown in FIG. 23, a semiconductor substrate 310 is mounted to a heating element 302. The heating element 302 has a surface with grooves 304 and raised portions 306. The raised portions 306 contact the lower surface of the substrate 310. Thermally insulative material or an airgap is provided between the grooves 304 and the lower surface of the substrate 310.

When activated, heating element 302 produces temperature variations in the substrate 310. Regions of substrate 310 contacting or close to the raised portions 306 are heated to a higher temperature than regions near the grooves 304.

A layer or layers of material 312, such as InGaAsP or InGaAlAs, for example, are deposited on an upper surface of substrate 310 as the varied active gain layer(s). It should be understood that the upper surface of the substrate 310 may include several other layers of material previously deposited or grown. The layer of material 312 may be deposited, for example, by molecular beam epitaxy (MBE) or metal organic chemical vapor deposition (MOCVD), for example.

The temperature variations in the substrate 310 can affect the deposition rate of material 312 on the surface of the substrate 310. As shown in FIG. 23, the material 312 may accumulate faster in the lower temperature areas of substrate 310. Consequently, the layer of material 312 is thicker in the areas above grooves 304 than the areas above raised portions 306. Of course, this effect can depend on the material deposited and the deposition conditions. For example, some materials may deposit thicker in areas above the raised portions 306 than in the areas above grooves 304. The composition of layer(s) 312 may also vary with temperature to cause gain peak wavelength shift.

Layer 312 may be etched back selectively or unselectively, for example, using an anisotropic etch, such as reactive etching (RIE). For example, for a unselective etch, the etching conditions may be set to etch portions of layer 312 to a depth equal to or slightly greater than the depth of the thinner regions of layer 312. After etching, the material of layer 312 will remain on the substrate 310 in the area where layer 312 was thick. Alternatively, the layer 312 may be selectively etched, for example, using an etch mask.

Figure 24:
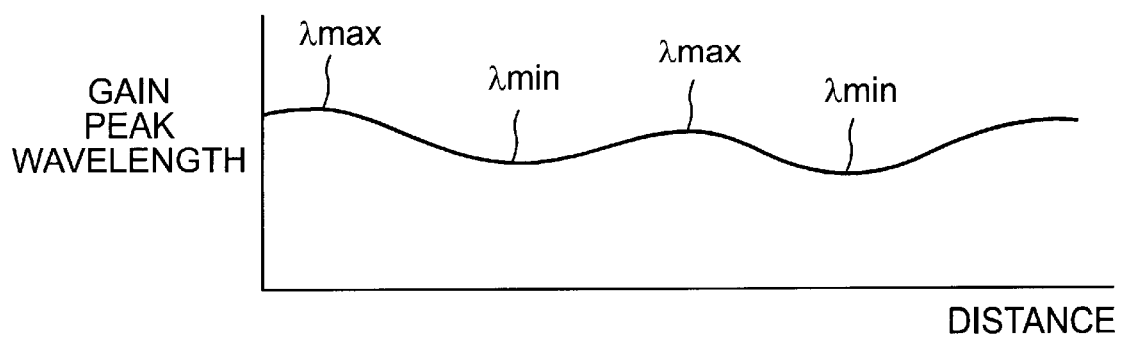
FIG. 24 provides a graph of the variation of gain peak wavelength with material thickness obtainable using the technique of FIG. 23.

FIG. 24 illustrates the dependence of peak gain wavelength on the thickness of material 312. FIG. 24 plots peak gain wavelength for the deposited material 312 over distance taken along the cross-section of substrate 310 shown of FIG. 23. Referring to both FIG. 23 and FIG. 24, one can see that the peak gain wavelength is at a local maximum $\lambda_{max}$ when the thickness of material 312 is at a local minimum $Th_{min}$. As the thickness of material 312 increases, the peak gain wavelength decreases. As the thickness of material 312 reaches a local maximum $Th_{max}$, the peak gain wavelength reaches a local minimum $\lambda_{min}$. FIG. 24 makes clear that peak gain wavelength depends on material thickness. Accordingly, by controllably varying the thickness of material in the active region 140 of the semiconductor optical amplifier device 136, peak gain wavelength may be varied to produce a desired composite gain profile for an application.

Figure 25:
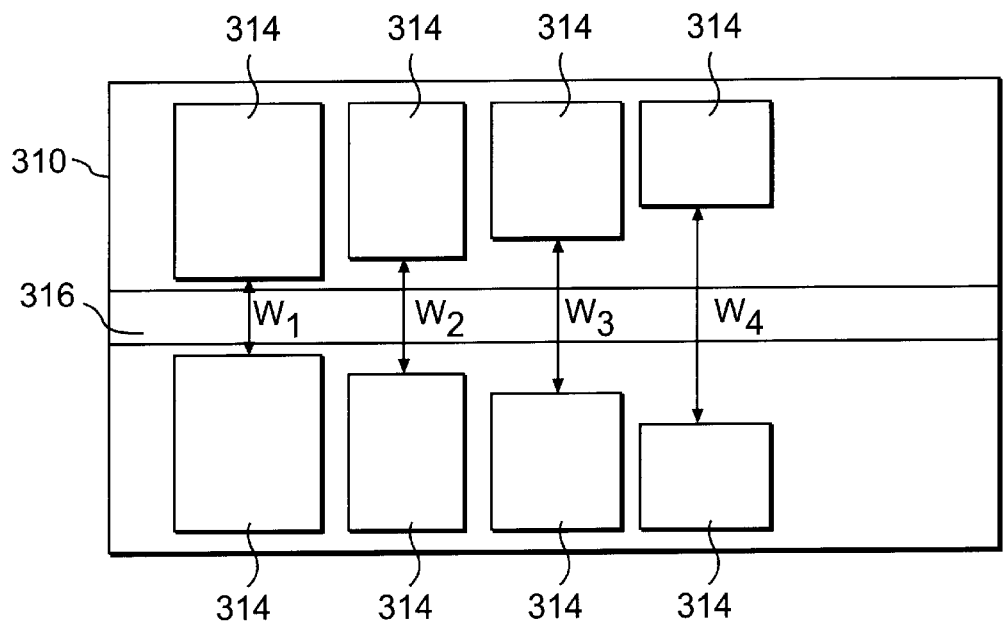
FIG. 25 illustrates a second exemplary technique for obtaining preferential deposition of material for a semiconductor optical amplifier in accordance with the present invention.

FIG. 25 illustrates a further embodiment for preferential deposition of material on substrate 310. FIG. 25 provides a top view of a portion of substrate 310. As shown, substrate 310 includes a plurality of pads 314. The pads 314 may be formed by deposition of silicon oxide (e.g., $SiO_2$), for example, through a chemical vapor deposition (CVD) process. The deposited silicon oxide may then be patterned using conventional photolithographic techniques to produce pads 314. In the example illustrated in FIG. 25, eight pads 314 are spaced apart on the surface of substrate 310. Of course, more or fewer pads 314 may be formed on the substrate 310.

In the portion of the substrate 310 illustrated in FIG. 25, the pads 314 are formed in two rows to define a channel 316 in between. The width of the channel 316 varies depending on the spacing of pads 314 in the first row from pads 314 in the second row. FIG. 25 shows the channel 316 with widths w1, w2, w3, and w4. Of course, this pattern, or portions of it, may be repeated over the remainder of the surface of the substrate 310.

After forming pads 314, a layer of material 312 is deposited on the substrate 310, for example, by MOCVD. The material 312, for example, GaAsInP or AlGaAs or other suitable material, does not deposit on the pads 314. Rather, the material 312 concentrates in the channel 316 between the pads 314. The thickness of deposited material 312 depends on the width of channel 316. The deposited material 312 forms thickest in the portion of channel 316 with width w1 and thinnest in the portion of channel 316 with width w4.

Following deposition, the pads 314 may be removed using a preferential etch that removes pads 314 without removing deposited material 312. Material 312 may be etched back, if desired, to produce a selected pattern of material 312 on substrate 310.

Figure 26:
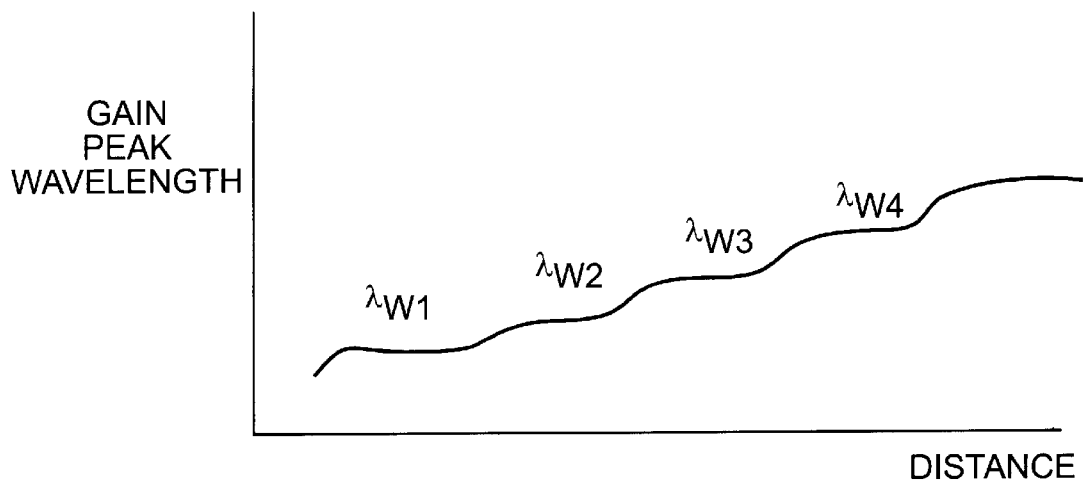
FIG. 26 provides a graph of the variation of gain peak wavelength with material thickness obtainable using the technique of FIG. 25.

FIG. 26 illustrates the dependence of peak gain wavelength on the thickness of material 312 deposited as described in connection with FIG. 25. FIG. 26 plots peak gain wavelength for the deposited material 312 over distance taken along the length of channel 316. Referring to FIGS. 25 and 26, the peak gain wavelengths $\lambda_{w1}$, $\lambda_{w2}$, $\lambda_{w3}$ and $\lambda_{w4}$ correspond to the peak gain wavelength produced by material 312 at channel widths w1, w2, w3, and w4, respectively. The lowest peak gain wavelength value $\lambda_{w1}$ corresponds to the region of channel width w1, where the material 312 is thickest. The peak gain wavelength values $\lambda_{w2}$, $\lambda_{w2}$, and $\lambda_{w3}$ progressively increase for regions of channel widths w2, w3, and w4, as the thickness of material 312 progressively decreases. Accordingly, pads 314 may be used to control the thickness of material 312 in the active region 140 of the semiconductor optical amplifier device 136 to produce selected peak gain wavelengths.

Figure 27:
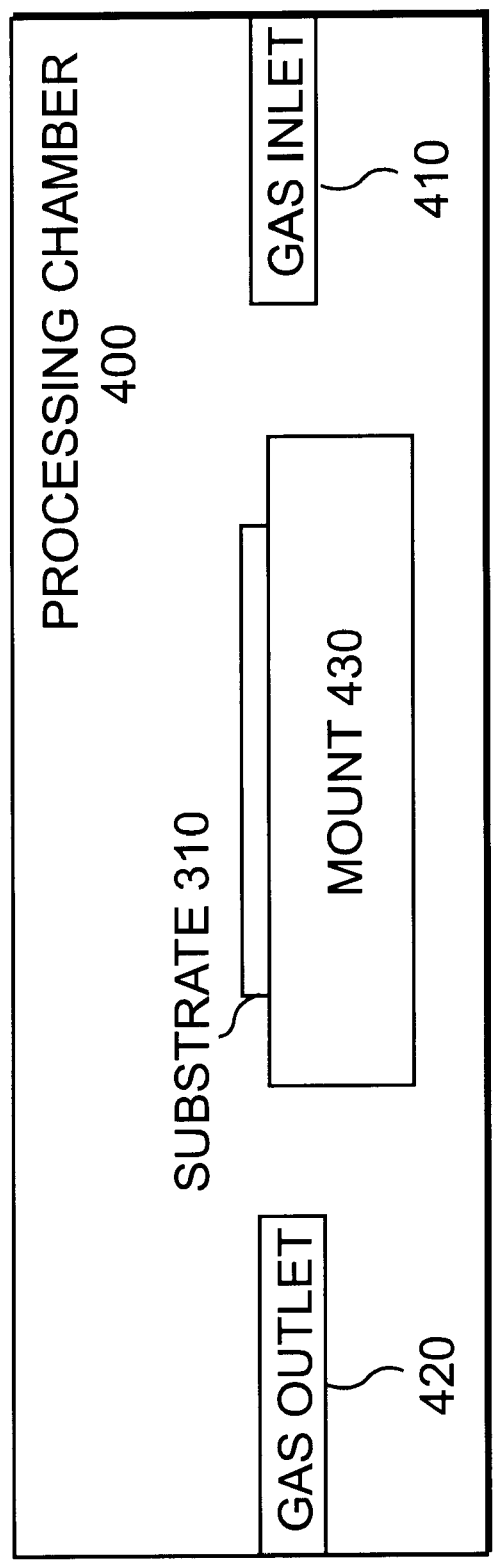
FIG. 27 illustrates a third exemplary technique for obtaining preferential deposition of material for a semiconductor optical amplifier in accordance with the present invention.

FIG. 27 illustrates a further example of a process for preferentially depositing material on the surface of substrate 310. FIG. 27 shows a processing chamber 400. The processing chamber 400 includes a gas inlet 410, a gas outlet 420, and a mount 430 between the gas inlet 410 and the gas outlet 420. Substrate 310 is mounted to the mount 430. Gas inlet 410 supplies reactant gases used to produce material 312 and possibly carrier gases used, for example, to control the pressure in chamber 400. Gas outlet 420 serves to exhaust gases formed as a byproduct of reaction or decomposition of the reactant gases, any carrier gases, and any remaining reactant gas. The processing chamber 400 may also include an energy source to promote the reaction and/or decomposition of the reactant gases.

In conventional processes, the submount 430 is rotated to produce an even distribution of the deposited material 412 over the surface of the substrate 310. To obtain the preferential deposition, the submount 430 is not rotated. Therefore, material 312 will tend to deposit thicker near an end of substrate 310 closer to gas inlet 410 than an end of substrate 310 closer to gas outlet 420.

A similar result may be achieved using an MBE deposition method. By maintaining the position of the substrate 310 relative to the beam source during deposition, the deposited material 312 will vary in thickness. In either a CVD or MBE process, the varying thickness of material deposited may be used in the formation of an active region 140 tailored to desired gain characteristics.

Figure 28:
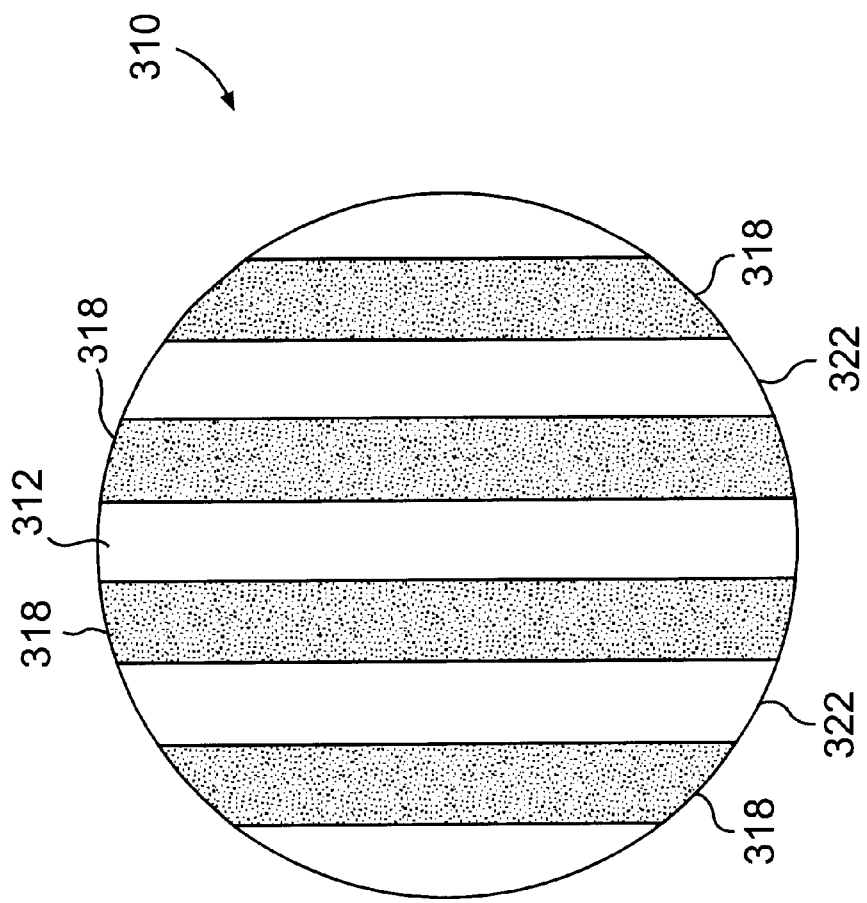
FIG. 28 illustrates an exemplary etch and re-growth technique for forming active subregions of a semiconductor amplifier in accordance with the present invention.

FIG. 28 illustrates an example of deposition and etching techniques that may be used to form subregions 140-1 to 140-N. Initially, a layer or layers of material 312-1 are formed on the substrate 310. The material 312-1 may be, for example, a layer of a quantum well structure or a multiple layers of a quantum well structure designed to produce a desired gain profile.

A mask 318 may then be formed on the material 312-1. The mask 318 overlies portions of material 312-1 and leaves other portions of material 312-1 exposed. Mask 318 may be formed, for example, of a silicon oxide (e.g., $SiO_2$) or a silicon nitride (e.g., $Si_3N_4$). The mask 318 may be formed as a continuous layer and then patterned using photolithographic techniques. After formation of the mask 318, material 312-1 may be etched. Portions of the material 312-1 underlying the mask 318 are protected from etching by mask 318. The exposed portions of material 3121 are etched. After etching material 312-1, the mask 318 may be removed, leaving a pattern of material 312-1.

A further layer or layers of material 312-2 may then be deposited over the substrate 310. The material 312-2 may be, for example, a layer of a quantum well structure or a multiple layers of a quantum well structure. Material 312-2 may be designed to produce a desired gain profile different from the gain profile produced by material 312-1. For example, the material 312-2 may be designed to have a different peak gain wavelength. Compared to material 312-1, material 312 may be formed of different material, different number of layers, different layer dimensions, different strain, different doping, and/or different proportions of the same material. For example, materials with different strain will have different energy bandgaps, and thus different gain peak wavelengths. For example, a material's compressive strain and/or tensile strain may be varied to produce, for example, a 0.1% to 2% change.

After depositing material 312-2, another mask 318 may be formed over the substrate 310, for example, by deposition and patterning. As described above, material 312-2 may be etched using the mask 318 to produce a pattern of material 312-2 adjacent to material 312-1. This deposition and etching process may be repeated to produce N different materials 312.

Figure 29:
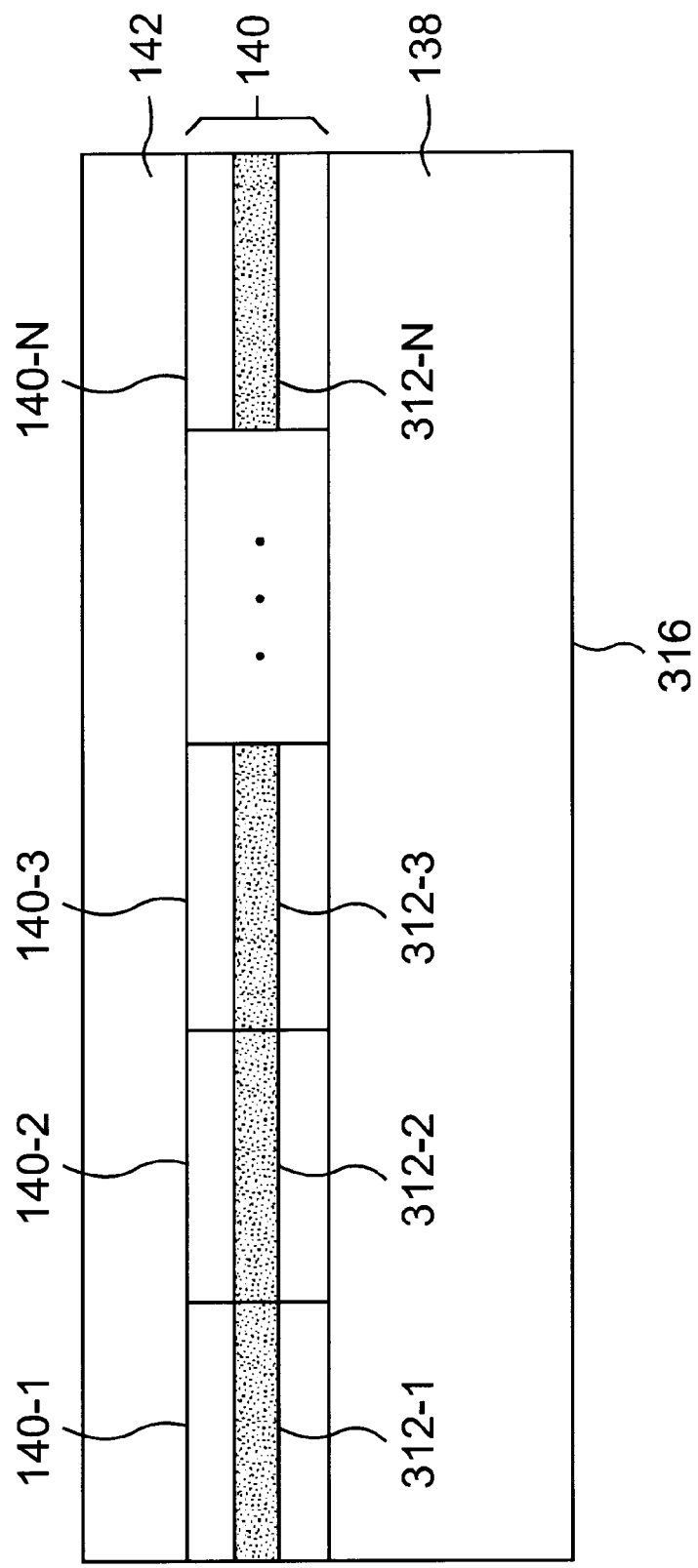
FIG. 29 illustrates an exemplary semiconductor optical amplifier having multiple active subregions formed in accordance with the techniques of FIG. 28.

FIG. 29 shows an example of a semiconductor optical amplifier device 136 produced by the multiple etching and deposition processes described in connection with FIG. 28. As shown, the semiconductor optical amplifier device 136 may include an active region 140 between p-type (n-type) semiconductor region 138 and n-type (p-type) semiconductor region 142. The active region 140 includes a plurality of subregions 140-1 to 140-N. Each subregion 140-1 to 140-N may produce different gain profiles for optical signals passing through the active region 140. Subregion 140-1 to 140-N may be formed in whole or in part by material 312-1 to 312-N, respectively, formed in accordance with the processes described above.

Figure 30:
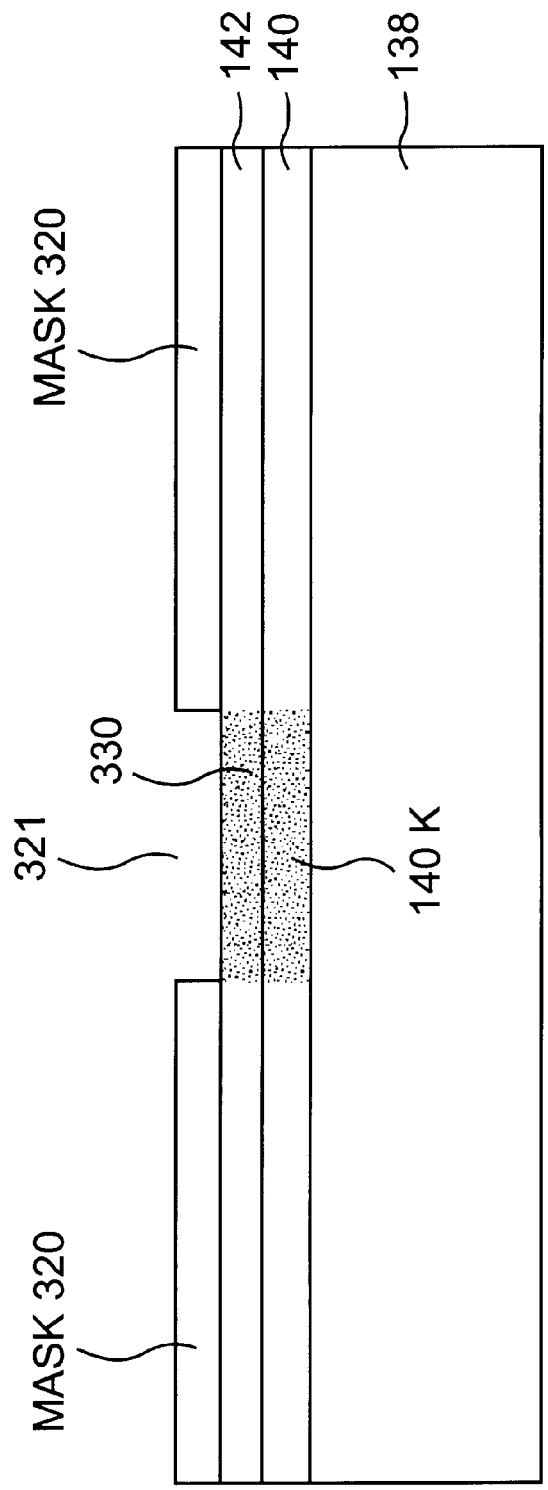
FIG. 30 illustrates an exemplary diffusion technique for forming active subregions of a semiconductor amplifier in accordance with the present invention.

FIG. 30 illustrates a further expedient for varying the gain profile of subregions of active region 140. As shown in FIG. 30, a mask 320 may be formed over substrate 310. The mask 320 includes an opening 321. Dopant 330 may be diffused into a subregion 140-K through the opening 321 of mask 320. For example, dopant 330 may be injected using ion implantation techniques. The energy of implantation may be selected to permit dopant to penetrate into subregion 140-K, but not penetrate through mask 320. The dopant 330 may be selected to alter the gain profile of subregion 140-K. For example, Zn may be used as dopant 330. Other dopants like S, Sn, or P, for example, may be used as well, such as those dopants known for changing the wavelengths of lasers.

After implanting dopant 330 into subregion 140-K, the mask 320 may be replace with a second mask having a second opening at a different location that opening 321. An second diffusion step may be performed through the second opening. The second implantation step may use a different dopant, implant to a different depth, produce a different doping concentration, and/or a different doping profile. This process may be repeated to produce the desired profile throughout the substrate.

It will be understood that the foregoing is merely illustrative of the principles of this invention, and that various modifications can be made by those skilled in the art without departing from the scope and spirit of the invention.

I claim:

1. An optical device comprising:
    an optical input that receives an input optical signal;
    an optical output that outputs a gain-compensated output optical signal;
    a dynamic gain adjusting filter that compensates for variations in optical signal spectral gain, the dynamic gain adjusting filter coupled between the optical input and the optical output and comprising at least one semiconductor optical amplifier; and
    an optical amplifier coupled between the optical input and optical output, wherein the dynamic gain adjusting filter compensates for variations in the spectral gain of the optical amplifier.

2. The optical device according to claim 1, wherein the optical amplifier is a rare-earth doped optical amplifier.

3. The optical device according to claim 1, wherein the optical amplifier comprises first and second amplifier stages, wherein at least a portion of the dynamic gain adjusting filter is coupled between the first and second amplifier stages.

4. The optical device according to claim 3, wherein the at least one semiconductor optical amplifier is coupled in series between the first and second amplifier stages.

5. An optical device comprising:
    an optical input that receives an input optical signal;
    an optical output that outputs a gain-compensated output optical signal; and
    a dynamic gain adjusting filter that compensates for variations in optical signal spectral gain, the dynamic gain adjusting filter coupled between the optical input and the optical output and comprising at least one semiconductor optical amplifier, wherein the dynamic gain adjusting filter further comprises a gain equalization filter coupled in series with the at least one semiconductor optical amplifier, the gain equalization filter operating to attenuate at least a portion of optical signals applied thereto.

6. An optical device comprising:

an optical input that receives an input optical signal;

an optical output that outputs a gain-compensated output optical signal;

a dynamic gain adjusting filter that compensates for variations in optical signal spectral gain, the dynamic gain adjusting filter coupled between the optical input and the optical output, wherein the dynamic gain adjusting filter comprises multiple semiconductor optical amplifiers coupled together in series, the multiple semiconductor optical amplifiers having different peak gain wavelengths; and an optical component coupled between at least two of the multiple semiconductor optical amplifiers, wherein the optical component comprises a fiber amplifier.

7. An optical device comprising:

an optical input that receives an input optical signal;

an optical output that outputs a gain-compensated output optical signal; and a dynamic gain adjusting filter that compensates for variations in optical signal spectral gain, the dynamic gain adjusting filter coupled between the optical input and the optical output, wherein the dynamic gain adjusting filter comprises multiple semiconductor optical amplifiers coupled together in series, the multiple semiconductor optical amplifiers having different peak gain wavelengths, wherein at least one of the multiple semiconductor optical amplifiers is a composite gain semiconductor optical amplifier having at least two regions that produce different peak gain wavelengths, wherein the composite gain semiconductor optical amplifier has a composite spectral gain formed by the combined spectral gains of the at least two regions.

8. An optical device comprising:

an optical input that receives an input optical signal;

an optical output that outputs a gain-compensated output optical signal;

a dynamic gain adjusting filter that compensates for variations in optical signal spectral gain, the dynamic gain adjusting filter coupled between the optical input and the optical output and comprising at least one semiconductor optical amplifier, wherein the at least one semiconductor optical amplifier is a composite gain semiconductor optical amplifier having at least two regions that produce different peak gain wavelengths, wherein the composite gain semiconductor optical amplifier has a composite spectral gain formed by the combined spectral gains of the at least two regions;

an optical monitor that monitors the input optical signal and generates a monitor signal based on the input optical signal; and a controller that generates a filter control signal responsive to at least the monitor signal, the filter control signal controlling a bias voltage applied to the at least one semiconductor optical amplifier.

9. A method of dynamically adjusting the spectral gain of an input optical signal to compensate for spectral gain variations, the method comprising:

coupling an input optical signal to a semiconductor optical amplifier;

biasing the semiconductor optical amplifier to compensate for spectral gain variations experienced by the input optical signal to thereby produce a gain-compensated output signal; and amplifying the input optical signal using a rare-earth doped fiber amplifier, wherein the biasing compensates for spectral gain variations of the fiber amplifier.

10. A method of dynamically adjusting the spectral gain of an input optical signal to compensate for spectral gain variations, the method comprising:

coupling an input optical signal to a semiconductor optical amplifier;

biasing the semiconductor optical amplifier to compensate for spectral gain variations experienced by the input optical signal to thereby produce a gain-compensated output signal;

amplifying the input optical signal before the step of coupling; and amplifying the gain-compensated output signal, wherein the biasing compensates for spectral gain variations in the amplifying steps so that the amplified gain-compensated output signal is amplified substantially uniformly.

* * * * *